(12) United States Patent
Hashimoto et al.

(10) Patent No.: US 9,711,944 B2
(45) Date of Patent: Jul. 18, 2017

(54) QUANTUM CASCADE LASER

(71) Applicant: SUMITOMO ELECTRIC INDUSTRIES, LTD., Osaka (JP)

(72) Inventors: Jun-ichi Hashimoto, Yokohama (JP); Manabu Shiozaki, Yokohama (JP); Hiroyuki Yoshinaga, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/205,610

(22) Filed: Jul. 8, 2016

(65) Prior Publication Data

US 2017/0012408 A1 Jan. 12, 2017

(30) Foreign Application Priority Data

Jul. 9, 2015 (JP) .................................. 2015-137922

(51) Int. Cl.
*H01S 5/00* (2006.01)
*H01S 5/125* (2006.01)
(Continued)

(52) U.S. Cl.
CPC .............. *H01S 5/125* (2013.01); *H01S 5/026* (2013.01); *H01S 5/2224* (2013.01); *H01S 5/2275* (2013.01); *H01S 5/3401* (2013.01); *H01S 5/3402* (2013.01); *H01S 5/34313* (2013.01); *H01S 5/34346* (2013.01); *H01S 5/0014* (2013.01); *H01S 5/02461* (2013.01)

(58) Field of Classification Search
CPC ........ H01S 5/125; H01S 5/026; H01S 5/3401; H01S 5/3402; H01S 5/34313; H01S 5/34346; H01S 5/2224; H01S 5/2275
See application file for complete search history.

(56) References Cited

U.S. PATENT DOCUMENTS

| 2006/0209911 A1* | 9/2006 | Takabayashi | ....... H01S 5/06256 372/20 |
| 2010/0246613 A1* | 9/2010 | Hasegawa | .............. B82Y 20/00 372/20 |
| 2016/0294159 A1* | 10/2016 | Hashimoto | ........... H01S 5/3402 |

OTHER PUBLICATIONS

Mothi Madhan Raj, et al., "Highly Uniform 1.5μm Wavelength Deeply Etched Semiconductor/Benzocyclobutene Distributed Bragg Reflector Lasers", Jpn. J. Appl. Phys. vol. 39 (2000), Dec. 15, 2000, pp. L1297-L1299.

\* cited by examiner

*Primary Examiner* — Kinam Park
(74) *Attorney, Agent, or Firm* — Smith, Gambrell & Russell, LLP

(57) ABSTRACT

A quantum cascade laser includes a substrate having a principal surface; a laser body region disposed on the principal surface, the laser body region including a semiconductor laminate structure having an end facet, the laser body region having a waveguide structure extending along a waveguide axis; and a distributed Bragg reflection region disposed on the principal surface, the distributed Bragg reflection region including low and high refractive index portions that are alternately arranged in a direction of the waveguide axis. The end facet of the semiconductor laminate structure is optically coupled to the distributed Bragg reflection region. Each of the high refractive index portions includes a semiconductor wall including upper and lower portions that are arranged in a direction intersecting with the principal surface of the substrate. The principal surface is disposed between the upper and lower portions. The lower portion includes a part of the substrate.

12 Claims, 15 Drawing Sheets

(51) Int. Cl.
*H01S 5/34* (2006.01)
*H01S 5/343* (2006.01)
*H01S 5/026* (2006.01)
*H01S 5/227* (2006.01)
*H01S 5/22* (2006.01)
*H01S 5/024* (2006.01)

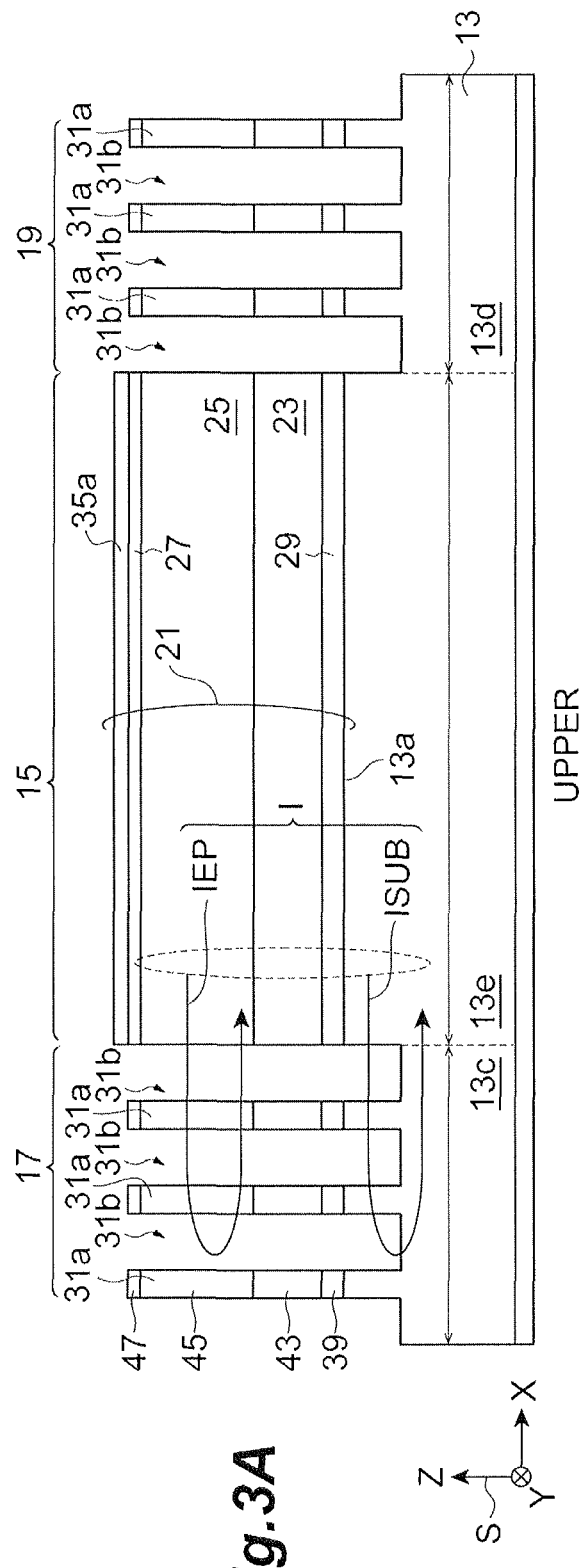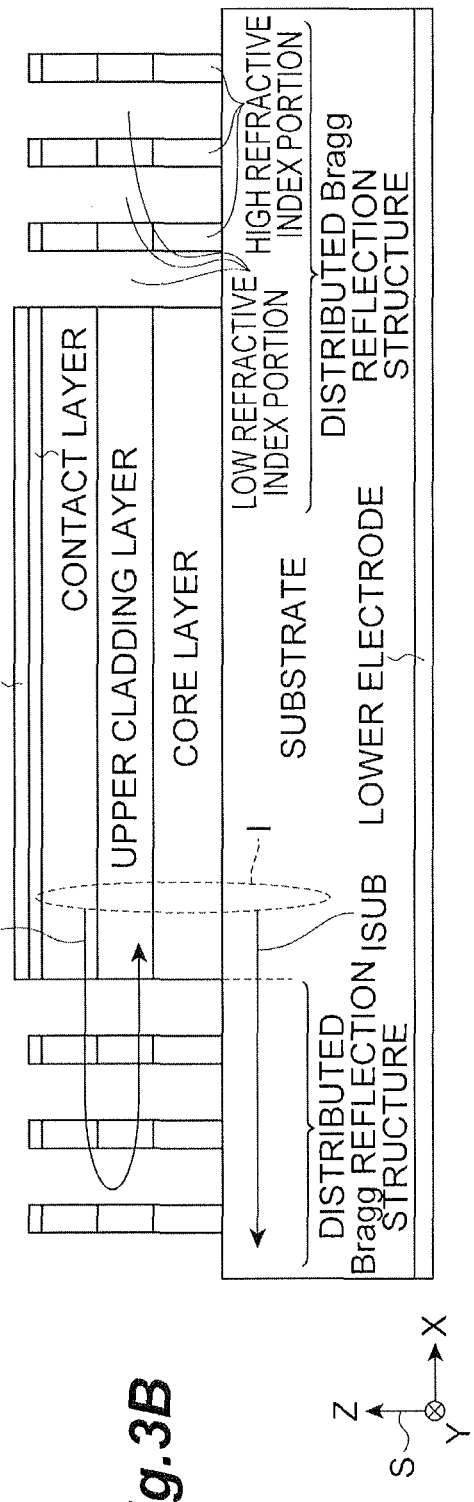
Fig.3A
Fig.3B

Fig.4

| DISTRIBUTED Bragg REFLECTION REGION | WL(μm) | WH(μm) |
|---|---|---|
| λ/4 STRUCTURE | 1.885 | 0.6064 |
| 3λ/4 STRUCTURE | 5.655 | 1.8192 |

*Fig.6*

| DISTRIBUTED Bragg REFLECTION REGION | λ/4 STRUCTURE | | 3λ/4 STRUCTURE | |
|---|---|---|---|---|
| NUMBER OF PAIRS | 1 PAIR | 2 PAIRS | 1 PAIR | 2 PAIRS |
| D=0.5 μm | 44.0% | 48.3% | 29.4% | 30.6% |
| D=3 μm | 64.4% | 72.4% | 44.3% | 47.2% |
| D=5.5 μm | 73.1% | 83.1% | 53.4% | 56.5% |

QUANTUM CASCADE LASER

BACKGROUND OF THE INVENTION

Field of the Invention

The present invention relates to a quantum cascade laser. This application claims the benefit of priority from Japanese Patent application No. 2015-137922 filed on Jul. 9, 2015, which is herein incorporated by reference in its entirety.

Related Background Art

A semiconductor laser for optical communications is disclosed by the following document: Jpn. J. Appl. Phys., Vol. 39, pp. L1297-1299, 2000, which will be referred to as Non-Patent Literature.

SUMMARY OF THE INVENTION

A quantum cascade laser according to an aspect of the present invention includes a substrate having a principal surface; a laser body region disposed on the principal surface of the substrate, the laser body region including a semiconductor laminate structure including a core layer disposed on the principal surface, the laser body region having a waveguide structure extending along a waveguide axis, the semiconductor laminate structure including an end facet intersecting with the waveguide axis; and a distributed Bragg reflection region disposed on the principal surface of the substrate, the distributed Bragg reflection region including one or more low refractive index portions and one or more high refractive index portions, the high refractive index portion having a refractive index higher than that of the low refractive index portion, the low refractive index portions and the high refractive index portions being alternately arranged in a direction of the waveguide axis. The laser body region and the distributed Bragg reflection region are arranged in a direction of the waveguide axis. The end facet of the semiconductor laminate structure is optically coupled to the distributed Bragg reflection region. Each of the high refractive index portions includes a semiconductor wall extending in a direction intersecting with the principal surface of the substrate. The semiconductor wall of the high refractive index portion includes an upper portion and a lower portion that are arranged in the direction intersecting with the principal surface of the substrate. The principal surface of the substrate is disposed between the upper portion and the lower portion. In addition, the lower portion of the semiconductor wall includes a part of the substrate.

The above-described objects and the other objects, features, and advantages of the present invention become more apparent from the following detailed description of the preferred embodiments of the present invention proceeding with reference to the attached drawings.

BRIEF DESCRIPTION OF THE DRAWINGS

FIG. 3A is a schematic cross sectional view illustrating the structure of the quantum cascade laser illustrated in FIG. 1, and FIG. 3B is a schematic cross sectional view illustrating the structure of the quantum cascade laser having a distributed Bragg reflection structure which is formed without etching the substrate.

FIG. 4 is a view showing a table of a width WH of a high refractive index portion and a width WL of a low refractive index portion for a calculation model.

FIG. 6 is a view showing a table of calculated values of the reflectivity at an oscillation wavelength (7.54 micrometers) among the calculated results.

DESCRIPTION OF EMBODIMENTS

Figure 1:
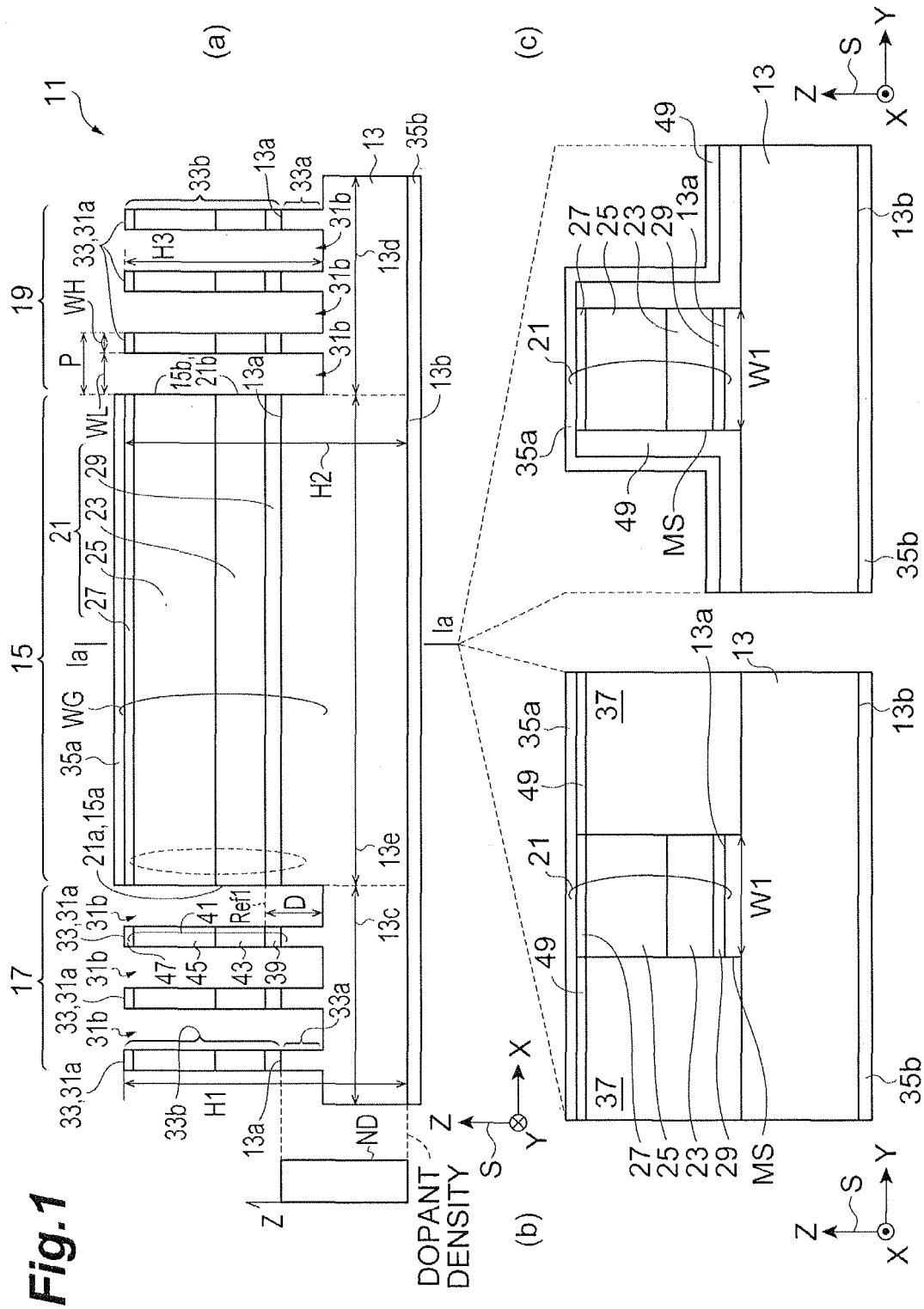
FIG. 1 is a schematic view illustrating a quantum cascade laser according to the present embodiment.

The semiconductor laser used for optical communications in the above-described document (Jpn. J. Appl. Phys., Vol. 39, pp. L1297-1299, 2000) includes a distributed Bragg reflection region.

The distributed Bragg reflection region is applicable to a quantum cascade laser, and the quantum cascade laser includes a laser body region and a distributed Bragg reflection region, which are formed by the following steps: growing a semiconductor laminate on a substrate; and processing the semiconductor laminate to form the laser body region and the distributed Bragg reflection region. The laser body region is provided on the substrate and includes a core layer of the quantum cascade laser, and the distributed Bragg reflection region is provided in one end portion or both end portions of the substrate so as to form an optical cavity. The core layer generates a light beam, and this light beam propagates through the laser body region and is emitted from the end of the laser body region outward to enter the distributed Bragg reflection region, which receives the emitted light beam and reflect it. The reflected light beam enters the laser body region and propagates through the laser body region again. The distributed Bragg reflection region in the semiconductor laser used for optical communications has a periodic refractive index profile, which is formed by etching a semiconductor epi-layer on the substrate. Specifically, the distributed Bragg reflection region includes a low refractive index portion of a void formed by etching a part of the semiconductor region other than the substrate, thereby being removed, and a high refractive index portion of the patterned semiconductor epi-layer formed by etching. The distributed Bragg reflection region having a high reflectivity contributes to improvement of characteristics of the quantum cascade laser. The following approaches are useful to make the reflectivity of the distributed Bragg reflection region high: increase of a refractive index difference between the low refractive index portion and the high refractive index portion; and increase of the number of repetitions in an array of the low refractive index portions and the high refractive index portions.

It was found that the reflectivity of the distributed Bragg reflection region in the quantum cascade laser may be enhanced by using another technical approach, as compared to the above-described approach. In order to obtain laser oscillation, the quantum cascade laser as described above causes a light beam to propagate in the laser body region and the distributed Bragg reflection region, which are formed by processing a semiconductor laminate grown on a substrate. Specifically, the light beam is generated in the core layer, and propagates through the laser body region and the distributed Bragg reflection region which is contained in the optical cavity. And then, the light beam is reflected by the distributed Bragg reflection region. As a result, laser oscillation occurs. In the laser oscillating state, the light beam expands in the substrate and also propagates in the substrate in addition to the laser body region and the distributed Bragg reflection region. It is found that a discontinuity of the above propagation of the light beam is formed at a boundary between the laser body region and the distributed Bragg reflection region. The light beam propagating in the laser body region has a profile broader than expected, thereby centering around the core layer and spreading to the substrate. A part of the light beam propagating through the laser body region goes across the above-described boundary to the distributed Bragg reflection region, and is reflected by the array of the low refractive index portions and the high refractive index portions. On the other hand, a part of the light beam propagating in the substrate of the laser body region goes straight to the substrate. The substrate has no periodic profile of refractive index, and such a uniform substrate does not reflect light propagating therein along a principal surface of the substrate. The distributed Bragg reflection region may reflect only a portion of the light beam because, in the above device structure, the distributed Bragg reflection region cannot reflect light propagating through the substrate. Therefore, it is difficult to obtain the distributed Bragg reflection region having high reflectivity for the quantum cascade laser.

It is an object of the present embodiment to provide a quantum cascade laser which can provide the distributed Bragg reflection region with a high reflectivity.

Specific examples will be described below.

A quantum cascade laser according to an embodiment includes (a) a substrate having a principal surface; (b) a laser body region disposed on the principal surface of the substrate, the laser body region including a semiconductor laminate structure including a core layer disposed on the principal surface, the laser body region having a waveguide structure extending along a waveguide axis, the semiconductor laminate structure including an end facet intersecting with the waveguide axis; and (c) a distributed Bragg reflection region disposed on the principal surface of the substrate, the distributed Bragg reflection region including one or more low refractive index portions and one or more high refractive index portions, the high refractive index portion having a refractive index higher than that of the low refractive index portion, the low refractive index portions and the high refractive index portions being alternately arranged in a direction of the waveguide axis. The laser body region and the distributed Bragg reflection region are arranged in a direction of the waveguide axis. The end facet of the semiconductor laminate structure is optically coupled to the distributed Bragg reflection region. Each of the high refractive index portions includes a semiconductor wall extending in a direction intersecting with the principal surface of the substrate. The semiconductor wall of the high refractive index portion includes an upper portion and a lower portion that are arranged in the direction intersecting with the principal surface of the substrate. The principal surface of the substrate is disposed between the upper portion and the lower portion. In addition, the lower portion of the semiconductor wall includes a part of the substrate.

According to the quantum cascade laser, the distributed Bragg reflection region has the low refractive index portions, which is formed by etching a substrate so as to provide each low refractive index portion with a desired depth. In addition, each of the semiconductor walls of the high refractive index portions has the bottom portion located under the principal surface of the substrate. Therefore, the semiconductor wall of the high refractive index portion includes a part of the substrate in the bottom portion. The distributed Bragg reflection region including the low refractive index portions and the high refractive index portions may reflect a substrate component of light, which spreads outside the core layer to the substrate. As a result, the distributed Bragg reflection region may reflect the substrate component of the light propagating in the substrate in addition to the optical component propagating in the semiconductor laminate structure disposed above the principal surface of the substrate. The quantum cascade laser may provide the distributed Bragg reflection region with a high reflectivity.

In the quantum cascade laser according to an embodiment, the substrate may include an n-type dopant, and the substrate may have a impurity concentration of the n-type dopant equal to or lower than $5 \times 10^{17}$ cm$^{-3}$.

According to the quantum cascade laser, the substrate has a low impurity concentration of the n-type dopant. Optical absorption caused by free carriers in the semiconductor substrate is suppressed. Therefore, light propagating in the semiconductor substrate (the substrate component of light) is not absorbed in the substrate. In addition, the low dopant density allows the substrate to work as a lower cladding region.

In the quantum cascade laser according to an embodiment, the upper portion of the semiconductor wall in the distributed Bragg reflection region includes the core layer of the semiconductor laminate structure.

In the quantum cascade laser according to an embodiment, in the direction intersecting with the principal surface of the substrate, the lower portion of the semiconductor wall may have a bottom that is apart from a lower surface of the core layer by 3 micrometers or more.

According to the quantum cascade laser, the distance between the lower surface of the core layer in the semiconductor wall and the bottom of the lower portion of the semiconductor wall is equal to or greater than the above-described value. In the quantum cascade laser, the distributed Bragg reflection region has a high reflectivity of 80% or higher, which is 2.5 times or more of the reflectivity (about 30%) of an end facet formed by cleavage. The distributed Bragg reflection region with the high reflectivity can make it easy to reduce a threshold current of the quantum cascade laser.

In the quantum cascade laser according to an embodiment, preferably, each of the low refractive index portions in the distributed Bragg reflection region has a thickness in a range of 1 to 1.1 times of an odd number multiple of $\lambda/(4 \times n1)$, and each of the high refractive index portions in the distributed Bragg reflection region has a thickness in a range of 1 to 1.1 times of an odd number multiple of $\lambda/(4 \times n2)$, where the thickness is defined in the direction of the waveguide axis, "$\lambda$" indicates a lasing wavelength of the quantum cascade laser in vacuum, "n1" indicates an effective refractive index of the low refractive index portions at the lasing wavelength, and "n2" indicates an effective refractive index of the high refractive index portions at the lasing wavelength.

According to the quantum cascade laser, the distributed Bragg reflection region includes the low and high refractive index portions of thickness values fallen within the respective ranges of 1 to 1.1 times of reference widths each equal to an odd number multiple of $\lambda/(4 \times n)$. In this case, the reflectivity of the distributed Bragg reflection region is practically the same as that of an ideal distributed Bragg reflection region having low and high refractive index portions of the thickness values equal to the above reference widths.

In the quantum cascade laser according to an embodiment, preferably, the distributed Bragg reflection region includes a first reinforcement portion connecting at least two high refractive index portions among the high refractive index portions with each other.

The distributed Bragg reflection region according to the quantum cascade laser includes a connecting wall for the first reinforcement portion that directly connects the semiconductor walls of the adjacent high refractive index portions to each other. The connecting wall and the adjacent semiconductor walls are physically connected independent of a physically connecting route via the substrate to form an integrated structure on the substrate. The addition of the first reinforcement portion can enhance mechanical strength of the distributed Bragg reflection region, so that the distributed Bragg reflection region is hardly damaged. Adding the first reinforcement portion to the distributed Bragg reflection region can improve the yield and the device durability.

In the quantum cascade laser according to an embodiment, preferably, each of the high refractive index portions has a first region connected to the first reinforcement portion, and the first region of the high refractive index portion is made of the same semiconductor material as that of the first reinforcement portion.

In the quantum cascade laser, since the first region of the high refractive index portion is made of the same semiconductor material as that of the first reinforcement portion, the first reinforcement portion and the first region of the high refractive index portion are crystallographically integrated with each other to form an uniform structure at an atomic level, thereby effectively increasing a mechanical strength of the distributed Bragg reflection region. The first reinforcement portion and the first region of the high refractive index portion are formed together with the same material to simplify the process for fabricating the laser.

In the quantum cascade laser according to an embodiment, preferably, the distributed Bragg reflection region includes a second reinforcement portion connecting a nearest high refractive index portion among the high refractive index portions with the laser body region.

The distributed Bragg reflection region of the quantum cascade laser has a bridging wall for the second reinforcement portion directly connecting the laser body region to the semiconductor wall of the high refractive index portion that is closest to the laser body region of the semiconductor laminate structure. Specifically, the bridging wall for the second reinforcement portion physically connects the semiconductor wall and the laser body region with each other independent of a physically connecting route via the substrate to form an integrated structure on the substrate. The addition of the second reinforcement portion can enhance mechanical strength of the distributed Bragg reflection region, so that the distributed Bragg reflection region is hardly damaged. Adding the second reinforcement portion to the distributed Bragg reflection region can improve the yield and the device durability.

In the quantum cascade laser according to an embodiment, preferably, each of the high refractive index portions has a second region connected to the second reinforcement portion, and the second region of the high refractive index portion is made of the same semiconductor material as that of the second reinforcement portion.

In the quantum cascade laser, since the second region of the high refractive index portion is made of the same semiconductor material as that of the second reinforcement portion, the second reinforcement portion and the second region of the high refractive index portion are crystallographically integrated with each other to form an uniform structure at an atomic level, thereby effectively increasing the mechanical strength of the distributed Bragg reflection region. The second region of the high refractive index portion and the second reinforcement portion are formed together with the same material to simplify the process for fabricating the laser.

In the quantum cascade laser according to an embodiment, preferably, the laser body region includes a connecting region connected to the second reinforcement portion, and the connecting region of the laser body region is made of the same semiconductor material as that of the second reinforcement portion.

In the quantum cascade laser, since the connecting region of the laser body region is made of the same semiconductor material as that of the second reinforcement portion, the second reinforcement portion and the connecting region of the laser body region are crystallographically integrated with each other to form an uniform structure at an atomic level, thereby effectively increasing the mechanical strength of the distributed Bragg reflection region. The connecting region of the laser body region and the second reinforcement portion are formed together with the same material to simplify the process for fabricating the laser.

In the quantum cascade laser according to an embodiment, preferably, a distance between the principal surface of the substrate and a top surface of each of the high refractive index portions in the semiconductor wall in a direction of an axis normal to the principal surface of the substrate is shorter than a distance between the principal surface of the substrate and a top surface of the semiconductor laminate structure in the laser body region.

The quantum cascade laser can prevent die-bonding in a epi-side down mounting from physically damaging the high refractive index portion, thereby making it possible to carry out the epi-side down mounting in the die bonding with an excellent yield.

In the quantum cascade laser according to an embodiment, preferably, each of the high refractive index portions has a width shorter than that of the substrate, and the width of the high refractive index portion and the width of the substrate are defined in a direction parallel to the principal surface of the substrate and in a direction orthogonal to the waveguide axis and an axis normal to the principal surface of the substrate.

According to the quantum cascade laser, each of the high refractive index portions of the distributed Bragg reflection region has the width shorter than that of the substrate. This structure may provide an etching process to form the high refractive index portion with excellent uniformity and reproducibility in the method of making the quantum cascade laser. The distributed Bragg reflection region also enhances the mechanical strength of the high refractive index portions, so that the distributed Bragg reflection region is hardly damaged. In addition, this distributed Bragg reflection region has a separation region, which can prevent the yield from lowering in the device separation process.

Teachings of the present invention can be readily understood by considering the following detailed description with reference to the accompanying drawings shown as examples. Referring to the accompanying drawings, embodiments of the present invention according to a quantum cascade laser and a method of producing a quantum cascade laser will be described. If possible, the same portions will be denoted by the same reference symbols.

FIG. 1 is a schematic drawing showing a quantum cascade laser according to the present embodiment. Referring to FIG. 1, a quantum cascade laser 11 includes a semiconductor substrate 13, a laser body region 15, and distributed Bragg reflection regions 17 and 19. In the embodiment, the semiconductor substrate 13 serves as a substrate. The semiconductor substrate 13 may be made of a compound semiconductor, and includes, for example, an InP substrate. The semiconductor substrate 13 has a principal surface 13a and a back surface 13b, and the principal surface 13a is opposite to the back surface 13b. The semiconductor substrate 13 includes a first region 13c, a second region 13d, and a third region 13e, and the third region 13e is provided between the first region 13c and the second region 13d. The distributed Bragg reflection regions 17 and 19 are disposed on the first region 13c and the second region 13d, respectively, and the laser body region 15 is disposed on the third region 13e. The semiconductor substrate 13 is made of, for example, n-type InP.

Referring to FIG. 1, an orthogonal coordinate system S is depicted. In the embodiment, the distributed Bragg reflection region 17, the laser body region 15 and the distributed Bragg reflection region 19 are arranged in the direction of the waveguide axis (the direction of the X axis in the orthogonal coordinate system S), and the principal surface 13a, specifically, the principal surface 13a in the third region 13e, is parallel to the plane that is defined by the X and Y axes of the orthogonal coordinate system S.

The laser body region 15 includes a waveguide structure WG extending in the direction of the X axis of the orthogonal coordinate system S. The waveguide structure WG in the laser body region 15 includes a first semiconductor laminate structure 21. The first semiconductor laminate structure 21 includes a core layer 23 disposed on the principal surface 13a, and an upper cladding layer 25 disposed on the core layer 23, and in the present embodiment, may further include a contact layer 27 and a buffer layer 29. The contact layer 27 is disposed on the upper cladding layer 25, and the buffer layer 29 is disposed between the semiconductor substrate 13 and the core layer 23. The first semiconductor laminate structure 21 includes end facets 21a and 21b intersecting with the waveguide axis that extends in the direction of the X axis of the orthogonal coordinate system S, and the laser body region 15 includes end facets 15a and 15b which intersect with the waveguide axis. The end facets 21a and 21b of the first semiconductor laminate structure 21 (the end facets 15a and 15b of the laser body region 15) are optically coupled to the distributed Bragg reflection regions 17 and 19, respectively. In the present embodiment, a lower surface of the buffer layer 29 is in contact with the principal surface 13a of the semiconductor substrate 13, and an upper surface of the buffer layer 29 is in contact with the core layer 23. However, the buffer layer 29 is not essential, and when the first semiconductor laminate structure 21 is not provided with the buffer layer 29, the core layer 23 is in contact with the principal surface 13a of the semiconductor substrate 13.

In the present embodiment, the laser body region 15 is disposed between the distributed Bragg reflection region 17 and the distributed Bragg reflection region 19, and the laser body region 15 and the distributed Bragg reflection regions 17 and 19 configure a laser cavity. The quantum cascade laser 11 may, however, include either one of the distributed Bragg reflection regions 17 and 19, and in this structure, the laser cavity may include, for example, a cleavage surface and the distributed Bragg reflection region. Here, a description will be given of the distributed Bragg reflection region 17 below, and the distributed Bragg reflection region 19 may have the same structure as the distributed Bragg reflection region 17, but it is not limited thereto.

The distributed Bragg reflection region 17 is provided with one or more high refractive index portions 31a. Each of the high refractive index portions 31a includes a semiconductor wall 33, which extends in the direction of the axis that intersects with the principal surface 13a of the semiconductor substrate 13 (for example, the direction of the Z axis of the orthogonal coordinate system S), and in the present embodiment, three semiconductor walls 33 are depicted in the figure. The distributed Bragg reflection region 17 also includes one or more low refractive index portions 31b, each of which is disposed between the high refractive index portions 31a made of semiconductor or between the laser body region 15 and the high refractive index portion 31a. Specifically, the first low refractive index portion 31b is positioned between the end facet 21a of the first semiconductor laminate structure 21 (the end facet 15a of the laser body region 15) and the nearest semiconductor wall 33 in the distributed Bragg reflection region 17. The second low refractive index portion 31b is positioned between the nearest semiconductor wall 33 and the next-nearest semiconductor wall 33 in the distributed Bragg reflection region 17. The third low refractive index portion 31b is positioned between the next-nearest semiconductor wall 33 and the third semiconductor wall 33 in the distributed Bragg reflection region 17. The refractive index of the high refractive index portions 31a is higher than the refractive index of the low refractive index portions 31b, and the low refractive index portions 31b and the high refractive index portions 31a are alternately arranged in the direction of the X axis of the orthogonal coordinate system S (the direction of the waveguide axis). In the present embodiment, each of the semiconductor walls 33 includes a bottom portion 33a and an upper portion 33b, and in the individual semiconductor wall 33, the bottom portion 33a, the principal surface 13a of the semiconductor substrate 13, and the upper portion 33b are sequentially arranged in the direction of the Z axis.

In the quantum cascade laser 11, the substrate is etched partly to a desired depth for forming the low refractive index portions 31b of the distributed Bragg reflection regions 17 and 19, and each of the semiconductor walls 33 of high refractive index has the bottom portion 33a located under the principal surface 13a of the semiconductor substrate 13. The semiconductor walls 33 may reflect a propagating light component, which spreads to the outside of the core layer 23 to be extended in the semiconductor substrate 13, at the interfaces between the low refractive index portions 31b and the high refractive index portions 31a. The distributed Bragg reflection regions 17 and 19 may reflect not only the light component propagating in the first semiconductor laminate structure 21 located above the principal surface 13a of the semiconductor substrate 13 but also the light component propagating in the semiconductor substrate 13 in the distributed Bragg reflection regions 17 and 19. Accordingly, the distributed Bragg reflection regions 17 and 19 of the quantum cascade laser 11 may be provided with a high optical reflection.

With reference to FIG. 1, the quantum cascade laser 11 will be described further in detail. Part (a) of FIG. 1 is a cross section, taken along a plane defined by two lines extending in the X and Z axial directions, showing the waveguide structure oriented in the X axial direction in which the laser waveguide extends according to the present embodiment. The laser body region 15 is provided on a center part of the device, and the distributed Bragg reflection regions 17 and 19, each having a distributed Bragg reflecting structure, are provided at both ends of the device, respectively. Here, in Part (a) of FIG. 1, a first height H1, a second height H2, and a third height H3 are defined as respective distances measured in the Z direction from the back surface 13b of the semiconductor substrate 13, in other words, in the direction of the axis normal to the principal surface of the substrate, and specifically, the first height H1 indicates the distance between the top of the high refractive index portion of the distributed Bragg reflection region and the back surface 13b of the semiconductor substrate 13; the second height H2 indicates the distance between the top (the contact layer 27 in the present embodiment) of the first semiconductor laminate structure 21 in the laser body region 15 and the back surface 13b of the semiconductor substrate 13; and the third height H3 indicates the distance between the top and bottom of the high refractive index portion 31a (each semiconductor wall 33). In the embodiment, the high refractive index portion 31a has the same height as that of the first semiconductor laminate structure 21 of the laser body region 15 (it is expressed as "H1=H2" by a numerical expression), but it is not limited thereto. The semiconductor substrate 13 is etched for forming the low refractive index portions of the distributed Bragg reflection regions 17 and 19, and the etching depth is defined as a distance D measured with respect to the reference plane Ref1 that extends along the boundary between the core layer 23 and the buffer layer 29 in the direction of the axis normal to the substrate principal surface.

One example of the laser body region 15.
The buffer layer 29: n-type InP, dopant density of $1 \times 10^{16}$ to $1 \times 10^{17}$ cm$^{-3}$, and thickness of zero nm or more and 500 nm or less.
The core layer 23 (light emitting layer).
A quantum well layer may include GaInAs, and a barrier layer may include AlInAs, which are an exemplary material suitable for light emission in a mid-infrared wavelength region. It is preferable that a superlattice structure configuring the core region includes these semiconductor layers. Transition between subbands in the conduction band allows lasing in a mid-infrared region of, for example, 3 to 20 µm. The upper cladding layer 25: n-type InP, dopant density of $5 \times 10^{16}$ to $5 \times 10^{17}$ cm$^{-3}$, and thickness of 2000 to 4000 nm.

The contact layer 27: n-type InGaAs, dopant density of $1 \times 10^{19}$ to $1 \times 10^{20}$ cm$^{-3}$, and thickness of 100 to 1000 nm. An upper electrode 35a is disposed on an upper surface of the laser body region 15, and a lower electrode 35b is disposed on the back surface 13b of the semiconductor substrate 13.

The semiconductor substrate 13 may function as a cladding region in the quantum cascade laser 11. In this case, it is important to suppress inter-band absorption and free carrier absorption of light in the substrate. In order to suppress the inter-band absorption, it is necessary to use the semiconductor substrate 13 formed of a semiconductor material that is transparent to light in mid-infrared wavelength range (for example, 3 to 20 µm). In other words, the semiconductor substrate 13 may be formed of a semiconductor material having a bandgap energy larger than energies of light corresponding to an mid-infrared wavelength range. For example, an n-InP substrate may be used as the semiconductor substrate 13 that satisfies the above condition. In addition, semiconductor layers configuring a mid-infrared quantum cascade laser are made of semiconductor materials each having a lattice constant equal to or close to InP, so that using an InP substrate allows these semiconductor layers to be grown with excellent crystal quality. It is preferable to use a lightly doped substrate as the substrate 13 to suppress the free carrier absorption caused thereby. The semiconductor substrate 13 needs to be conductive for supplying current to the quantum cascade laser 11. In the quantum cascade laser, only electron is generally used as carrier to achieve laser emission. As illustrated in Part (a) of FIG. 1, an n-type conductivity substrate with a practically constant profile of a dopant density ND in the direction from the principal surface 13a to the back surface 13b (the direction of the Z axis) is usually used as the substrate. It is preferable that the dopant density ND is equal to or lower than $5 \times 10^{17}$ cm$^{-3}$. Using the semiconductor substrate 13 of such a low dopant density ND may suppress the free carrier absorption of the light component propagating in the semiconductor substrate 13, so that the semiconductor substrate 13 may be used as a lower cladding layer. In this case, the semiconductor substrate 13 has a conductivity type that is the same as that of the upper cladding layer 25. In the embodiment, the conductivity type of the semiconductor substrate 13 is an n-type, for example.

If needed, the buffer layer 29 may be applied to the quantum cascade laser 11. Growing the buffer layer 29 on the semiconductor substrate 13 first may terminate defects, associated with an etch pit density (EPD), which are exposed on a surface of the substrate, such as InP, so that a group of semiconductor layers to be laminated can be grown on the buffer layer 29 with excellent crystallinity. Since the purpose to grow the buffer layer 29 is to terminate the defects as described above, the buffer layer 29 may be a thin layer with a thickness of about 0.5 µm or thinner. The thin buffer layer 29 cannot function as a cladding layer for optical confinement. When the laser body region 15 with the excellent crystallinity is grown without using the buffer layer 29, the buffer layer 29 may be omitted. Similarly to the semiconductor substrate 13, the buffer layer 29 is preferably made of semiconductor material, such as n-InP, n-GaInAs, and n-GaInAsP. By using these materials for the buffer layer 29, the inter-band absorption of the propagating light may be reduced in the buffer layer 29.

As described above, since InP is transparent to mid-infrared lasing light, the upper cladding layer 25 may include, for example, n-type InP. InP is a binary mixed crystal and lattice-matches with the InP substrate 13. Therefore, the upper cladding layer 25 of n-type InP with an excellent crystal quality may be formed on the InP substrate 13. Further, since InP is one of the materials having the highest heat conduction among semiconductor materials usable for the mid-infrared quantum cascade laser, the cladding layer 25 of InP, which is near the core layer 23 in the quantum cascade laser 11, can achieve excellent heat radiation from the core layer 23, thereby improving temperature characteristics of the quantum cascade laser 11.

The core layer 23 includes a structure in which unit structures, each of which is composed of an active layer and an injection layer, are connected in multiple stages in several-tens periods. The active layer and the injection layer each have a superlattice formed of quantum well layers and barrier layers which are alternately stacked. Each quantum well layer is a thin film with, for example, a thickness of several nanometers. Each barrier layer is a thin film with, for example, a thickness of several nanometers and has a higher bandgap than that of the quantum well layer.

If needed, the quantum cascade laser 11 may include the contact layer 27. The contact layer 27 is in contact with the upper electrode 35*a* and forms an excellent ohmic contact therewith. When the semiconductor substrate 13 is made of InP, it is preferable that the contact layer 27 is made of a material which has a low bandgap and lattice-matches with the semiconductor substrate 13 of InP, and may include, for example, n-type GaInAs. The upper electrode 35*a* and the lower electrode 35*b* may include, for example, Ti/Au or Ge/Au. When electrical contact to the electrode is possible without the contact layer, the contact layer 27 may be omitted.

If needed, the core layer 23 may include an optical confinement region(s) provided on either upper or lower side thereof or both upper and lower sides. The addition of the optical confinement region(s) can enhance optical confinement of the propagating light into the core region disposed between the cladding layers. The optical confinement region includes a semiconductor material of a higher refractive index, compared to the cladding layers, enough to reinforce the optical confinement. When the semiconductor substrate 13 is made of InP, it is desirable that such an optical confinement region is made of a material, which may lattice-match with the semiconductor substrate 13 of InP, such as undoped and/or n-type GaInAs.

An n-type dopant which imparts n-type conductivity to semiconductor can be, for example, Si, Sn, and Se.

Parts (b) and (c) of FIG. 1 are cross sectional views, taken along an Ia-Ia line indicated in Part (a) of FIG. 1, each of which shows a current confinement structure applicable to the quantum cascade laser illustrated in Part (a) of FIG. 1. One of the current confinement structures shown in Parts (b) and (c) of FIG. 1 is used for the quantum cascade laser illustrated in Part (a) of FIG. 1. Each cross section is shown as a YZ cross section in the orthogonal coordinate system S. Referring to Parts (b) and (c) of FIG. 1, a mesa waveguide MS is positioned in the center of the quantum cascade laser. The mesa waveguide MS includes the buffer layer 29, the core layer 23, the upper cladding layer 25 and the contact layer 27, which are laminated on the semiconductor substrate 13. The mesa waveguide MS has a width W1, which ranges, for example, from 3 to 10 micrometers in the quantum cascade laser 11.

Referring to Part (b) of FIG. 1, the mesa waveguide MS is buried by a burying layer 37 of high-resistance semiconductor that functions as a current blocking layer for current confinement. An insulating film 49 is formed on the semiconductor burying layer 37 to reinforce the current constriction to the mesa waveguide MS. This structure is referred to as a buried heterostructure ("BH structure").

Referring to Part (c) of FIG. 1, the sides of the mesa waveguide of the width W1, which are formed by etching, and the etched surface of the semiconductor substrate 13 are covered with the insulating film 49 for the current confinement. This structure is referred to as a high-mesa structure in which the insulating film 49 formed on the side surfaces of the mesa waveguide MS constricts current. The insulating film 49 is made of, for example, a dielectric film.

The semiconductor wall 33 configuring the high refractive index portion 31*a* in the distributed Bragg reflection region 17 may have any of various structures, and in the present embodiment, the high refractive index portions 31*a* may include a first semiconductor layer 39 which corresponds to the buffer layer 29, a second semiconductor layer 43 which corresponds to the core layer 23, a third semiconductor layer 45 which corresponds to the upper cladding layer 25, and a fourth semiconductor layer 47 which corresponds to the contact layer 27. The first semiconductor layer 39, the second semiconductor layer 43, the third semiconductor layer 45, and the fourth semiconductor layer 47 form a second semiconductor laminate structure 41.

The semiconductor wall 33 is formed by etching a semiconductor epitaxial laminate for the laser body region 15. A cross section of the semiconductor wall 33, which is taken along a plane parallel to the YZ plane, is practically the same as each of the respective cross sections shown in Parts (b) and (c) of FIG. 1, except that the present cross section for the semiconductor wall 33 does not include the upper electrode 35*a* provided in the structure shown in Parts (b) and (c) of FIG. 1.

Figure 2:
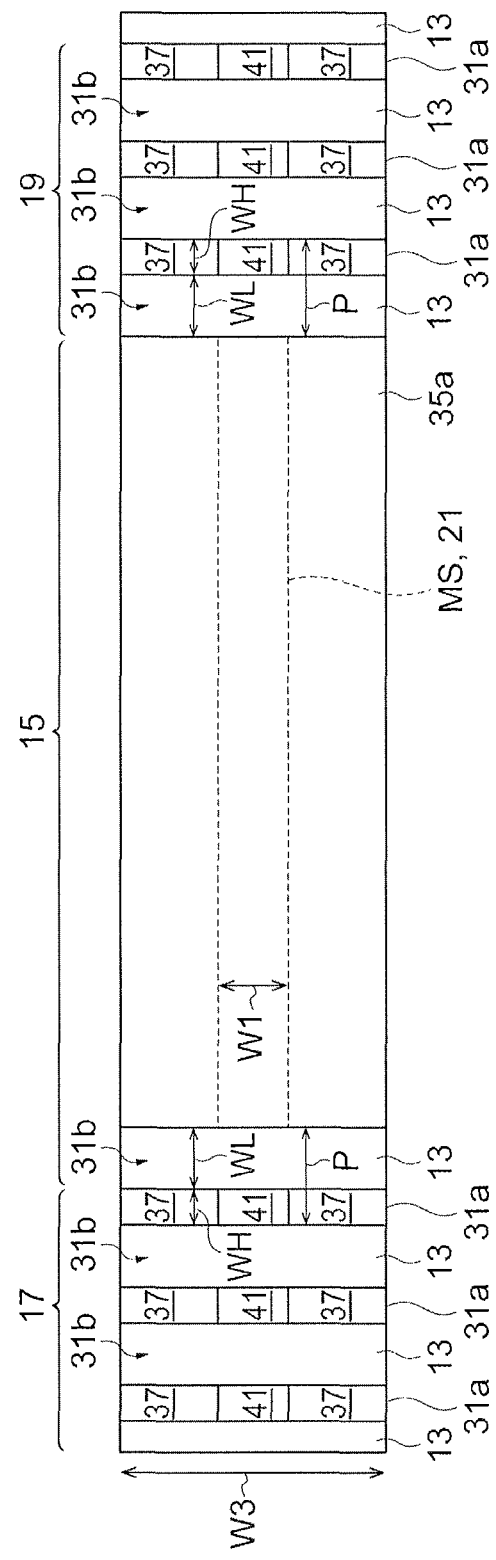
FIG. 2 is a plan view illustrating the quantum cascade laser having a BH structure illustrated in FIG. 1.

FIG. 2 is a plan view illustrating the quantum cascade laser of the BH structure illustrated in Part (b) of FIG. 1. Here, a description will be given of the distributed Bragg reflection regions 17 and 19. The distributed Bragg reflection region 17 (19) includes the high refractive index portions 31*a* of a predetermined width WH and the low refractive index portions 31*b* of a predetermined width WL as illustrated in FIG. 1, and the high refractive index portions 31*a* and the low refractive index portions 31*b* are alternately arrayed therein. In the distributed Bragg reflection regions 17 and 19, the array of the high refractive index portions 31*a* and the low refractive index portions 31*b* has a period P (=WL+WH). As already described, the low refractive index portions 31*b* are formed by removing the part of the semiconductor epitaxial laminate for the laser body region 15 in the etching process, and the high refractive index portions 31*a* are the remaining parts of the semiconductor epitaxial laminate formed in the etching process. In etching the semiconductor epitaxial laminate to form the distributed Bragg reflection regions 17 and 19 in a fabricating method, the semiconductor wall 33 forming the high refractive index portion 31*a* may have the same semiconductor laminate structure as the laser body region 15, and have the bottom portion 33*a* formed of a part of the semiconductor substrate 13. As illustrated in FIG. 2, each of the high refractive index portions 31*a* extends in the Y direction to reach an edge of the side surface of the quantum cascade laser, and the width of the high refractive index portions 31*a* is equal to a width W3 of the quantum cascade laser in the Y direction.

Each low refractive index portion 31*b* may be a gap defined by the interval between the semiconductor walls 33 configuring the high refractive index portions 31*a* or between the laser body region 15 and the semiconductor wall 33 closest thereto, and these gaps may be formed of a gas, such as air. Alternatively, the low refractive index portions 31b may be formed by filling the gap(s) with a dielectric material of a refractive index, such as SiO2, SiON, SiN, alumina, a BCB resin, and a polyimide resin, which has a refractive index lower than that of the semiconductor walls 33 configuring the high refractive index portions 31a. Referring to Part (a) of FIG. 1, in the present embodiment, the low refractive index portions 31b are the gaps that are formed of atmospheric air. When the low refractive index portions 31b are filled with the gas, such as air in voids, between the semiconductor walls 33, the refractive index of the air is the lowest (roughly equal to 1), so that a refractive index difference between the low refractive index portions 31b and the high refractive index portions 31a can be made large. A high reflectivity can be imparted to the distributed Bragg reflection regions 17 and 19 as the refractive index difference becomes larger. This results in that, the low refractive index portions 31b of air can impart a high reflectivity to the distributed Bragg reflection regions 17 and 19 for the cavity. As described above, the low refractive index portions 31b may be made of a dielectric material filling gaps located between the high refractive index portions 31a each of which is a thin piece with the width of a micrometer order, and hold both sides of each high refractive index portion 31a. Supporting the high refractive index portions 31a can improve the mechanical strength of the high refractive index portions 31a. In the structure that uses either one of the air filling and the dielectric filling for the low refractive index portions 31b, the low refractive index portions 31b are also provided between the bottom portions 33a of the semiconductor walls 33 in the high refractive index portions 31a. In the low refractive index portions 31b, the upper portion and the bottom portion may be defined similarly to the semiconductor wall 33, and the bottom portion of the low refractive index portion 31b is positioned below the reference plane Ref1 indicated in Part (a) of FIG. 1.

A description will be given of the semiconductor burying layer in the BH structure. The semiconductor burying layer 37 of the BH structure includes, for example, an undoped or semi-insulated semiconductor. These semiconductors exhibit high resistance to the electron (carrier) of the quantum cascade laser, and are suitable for a material of the current blocking semiconductor layer thereof. The material allows the semiconductor burying layer 37 to function as an excellent current blocking layer, which confines current into the mesa waveguide region thereof.

Semi-insulating semiconductor that may be used as the current blocking semiconductor layer encompasses a III-V compound semiconductor doped with a transition metal, such as Fe, Ti, Cr or Co. The addition of the transition metal(s) in the III-V compound semiconductor creates deep levels, which can trap electrons, in a forbidden band of the semiconductor so as to achieve semi-insulating characteristics. In most cases, Fe is used as the dopant to obtain the semi-insulating semiconductor. The addition of the above transition metal(s) makes the III-V compound semiconductor semi-insulating, so that the III-V compound semiconductor has a sufficiently high resistance property of, for example, $10^5$ ($\Omega \cdot cm$) or higher to electron. The semiconductor of such high resistance characteristics functions as an excellent semiconductor burying layer (a current blocking layer). Undoped semiconductor may have high resistance characteristics enough for the device. In this case, the undoped semiconductor is also usable for the semiconductor burying layer 37. Specifically, the undoped or semi-insulating III-V compound semiconductor includes, for example, InP, GaInAs, AlInAs, GaInAsP, and AlGaInAs. These materials, which lattice-match with the InP substrate, can be thus grown on the InP substrate using a growth reactor for an MBE method or an OMVPE method, and are suitable for the semiconductor burying layer 37 of the quantum cascade laser according to the present embodiment.

Another advantage is as follows: the undoped or semi-insulating semiconductor has few free carriers (the free carriers are electrons in the quantum cascade laser) acting as a strong light absorption source in the mid-infrared region, so that free carrier absorption to mid-infrared light is very low. In particular, InP, GaInAs, AlInAs, GaInAsP and AlGaInAs as described above each have a large bandgap allowing these materials to be transparent to the mid-infrared light, so that the materials have no light absorption caused by inter-band transition (primary optical absorption different from the free carrier absorption). Accordingly, the InP, GaInAs, AlInAs, GaInAsP and AlGaInAs that are undoped or semi-insulating are also transparent to the mid-infrared light. The semiconductor burying layer 37 made of these semiconductors can effectively suppress the light absorption caused by free carriers and the light absorption caused by the inter-band transition, thereby providing excellent lasing characteristics.

Further, the semiconductor burying layer 37 of one or more semiconductors, which have high heat conduction, among these undoped or semi-insulating semiconductors can improve heat dissipation of the device to allow the device to operate in high temperatures. In particular, InP is one of semiconductors having the large heat conductivity among semiconductor materials usable for the mid-infrared quantum cascade laser. InP in the quantum cascade laser allows the laser to have a high heat dissipation. InP, which is a binary mixed crystal, makes it easy to grow semiconductor crystal with excellent crystalline quality on InP substrates, and accordingly is suitable for the semiconductor burying layer 37.

Instead of InP, other semiconductors, such as AlInAs or AlGaInAs, may be used for the semiconductor burying layer 37. The application of AlInAs and/or AlGaInAs with a higher bandgap than that of InP to the semiconductor burying layer 37 can create a larger energy discontinuity at the band edge between the conduction bands of the semiconductor burying layer 37 and each of the layers, adjoined to the semiconductor burying layer 37, included in the mesa waveguide MS, as compared to the semiconductor burying layer 37 of InP. Such a high energy discontinuity forms a high energy barrier (the energy barrier to electron in the present embodiment) at an interface between the semiconductor burying layer 37 and the semiconductor of the mesa waveguide MS. In addition to the high resistance of the semiconductor burying layer 37 itself, the high energy barrier of AlInAs and AlGaInAs can effectively suppress the leakage of electrons from the mesa waveguide MS to the semiconductor burying layer 37. As a result, the resistance of the semiconductor burying layer 37 is made higher to the electron, so that the semiconductor burying layer 37 more strongly constrict current to the mesa waveguide MS to provide the quantum cascade laser 11 with an excellent lasing characteristics.

In addition, the insulating film 49 on the semiconductor burying layer 37 in the BH structure may include a dielectric insulating film, and the dielectric insulating film includes, for example, SiO2, SiON, SiN, alumina, a BCB resin and a polyimide resin. These dielectric insulating materials have excellent durability and/or insulating property. These dielectric insulating films can be formed using an apparatus for forming a dielectric film, by such as sputtering, chemical vapor deposition (CVD) or a spin coating, and makes it easy to apply the forming process to the fabrication of the device. If needed, the quantum cascade laser 11 is provided with the insulating film 49, which may be omitted if the semiconductor burying layer 37 alone can achieve the sufficient current constriction to the mesa waveguide MS.

Referring to FIGS. 3A and 3B, a description will be given of improvements based on the structure of the quantum cascade laser 11. FIG. 3A illustrates a main portion of the structure of the quantum cascade laser 11 shown in FIG. 1. FIG. 3B illustrates a principal portion of a quantum cascade laser having a distributed Bragg reflection structure which is formed without etching the substrate and which has low refractive index portions, formed by etching, of an etching depth shallower than that in the distributed Bragg reflection region 17 (19) of the quantum cascade laser 11, shown in FIG. 1, in the Z direction. FIG. 3A shows the distribution of the propagating light I including components IEP and ISUB indicating the spread of light in the direction of the Z axis. For convenience of reference, FIG. 3B also shows the distribution of the propagating light I with the same reference symbols. In the quantum cascade laser in FIG. 3B, the distributed Bragg reflection structure can reflect the component IEP of the light I propagating in the semiconductor laminate of the laser body region, but cannot sufficiently reflect the component ISUB of the light I propagating in the substrate region (the lower cladding layer) because the distributed Bragg reflection structure is shallow. In contrast, the structure of the present embodiment can reflect not only the component IEP but also the component ISUB, which propagate in the first semiconductor laminate structure 21 and the semiconductor substrate 13, respectively, at the interfaces between the low refractive index portions 31b and the high refractive index portions 31a in the distributed Bragg reflection region 17 (19) because the semiconductor substrate 13 is etched to a desired depth (the light I is extended in the depth) to form the low refractive index portions 31b of the distributed Bragg reflection region 17 (19). The distributed Bragg reflection region 17 (19) of this structure in the quantum cascade laser 11 can reflect almost all of the propagating light, including the component propagating in the semiconductor substrate 13. This shows that the quantum cascade laser illustrated in FIG. 3B has practical singularity but that the quantum cascade laser 11 does not have such singularity.

Example 1

In order to demonstrate the reduction of the singularity and increase of the reflectivity of the distributed Bragg reflection region, a numerical experiment is conducted. A calculation model for the numerical experiment will be described. The laser body region of the calculation model includes a waveguide structure equivalent to that of the semiconductor laminate structure illustrated in FIG. 1. The high refractive index portions of the distributed Bragg reflection region in the calculation model have the same semiconductor laminate structure as the waveguide structure of the laser body region, and each of the low refractive index portions is a gap and is specifically filled with air. Each of the high refractive index portions in the calculation model includes a semiconductor wall with ideal etched sides extending perpendicular to the principal surface of the substrate.

The contact layer: n-type InGaAs, thickness of 0.1 μm.
The upper cladding layer: n-type InP, thickness of 3 μm.
The core layer: AlInAs/GaInAs superlattice structure, thickness of 1.7 μm.

The buffer layer: n-InP, thickness of 0.5 μm.
The semiconductor substrate: n-type InP, thickness of 100 μm.

In order to provide the distributed Bragg reflection region having a high reflectivity, the width WL of the low refractive index portions and the width WH of the high refractive index portions can be set at the odd number multiple of a reference width $\lambda/(4\times n)$ (here, "$\lambda$" is the lasing wavelength of the quantum cascade, and "n" is the effective refractive index of the low refractive index portions or the high refractive index portions at the lasing wavelength) in a direction in which the waveguide structure of the laser body region extends. Usually, the width WL of the low refractive index portions and the width WH of the high refractive index portions are often set at $\lambda/(4\times n)$ or $3\times\lambda/(4\times n)$. The width WL of the low refractive index portions and the width WH of the high refractive index portions in the calculation model are $\lambda/(4\times n)$ or $3\times\lambda/(4\times n)$. In the following description, the former is referred to as "$\lambda/4$ structure" and the latter is referred to as "$3\lambda/4$ structure". FIG. 4 illustrates the width WH of the high refractive index portions and the width WL of the low refractive index portions of the calculation model.

The reflectivity of the distributed Bragg reflection region in the above-described model is calculated using a software for electromagnetic field analysis of a finite element method basis. The calculation of reflectivity is performed by taking various optical factors, such as diffraction and scattering, in the distributed Bragg reflection region into consideration, whereby calculation results close to those of actual devices are provided. Specifically, a relationship between an etching amount D of the substrate in areas of which the low refractive index portions of the distributed Bragg reflection region are to be formed, and reflection characteristics of the distributed Bragg reflection region thus formed is derived by the calculation. The etching amount D of the substrate, as described above, is defined as a distance from the interface (labelled as Ref1) between the core layer 23 and the buffer layer 29, illustrated in FIG. 1, to the bottom of the low refractive index portions 31b in the direction of the axis normal to the principal surface 13a of the substrate. In consideration of calculation efficiency, the calculation is conducted using a two-dimensional model which has a mesh for the finite element method formed on a plane corresponding to the cross section (referred to as XZ cross section) showing the waveguide structure in FIG. 1, and which assumes that the epi structure on the XZ cross section extends in the direction of the Y axis. In addition, since the quantum cascade laser oscillates in a TM mode, the oscillation mode is set to the TM mode and the oscillation wavelength is assumed to be 7.54 micrometers which is the actual oscillation wavelength in the quantum cascade laser having the structure of this calculation model. Further, the thickness (which is defined in the direction of the Z axis) of the buffer layer, positioned just below the core layer, is set at 0.5 micrometer, and for example, the distributed Bragg reflection region where the substrate is not etched at all corresponds to D=0.5 micrometer.

Figure 5A:
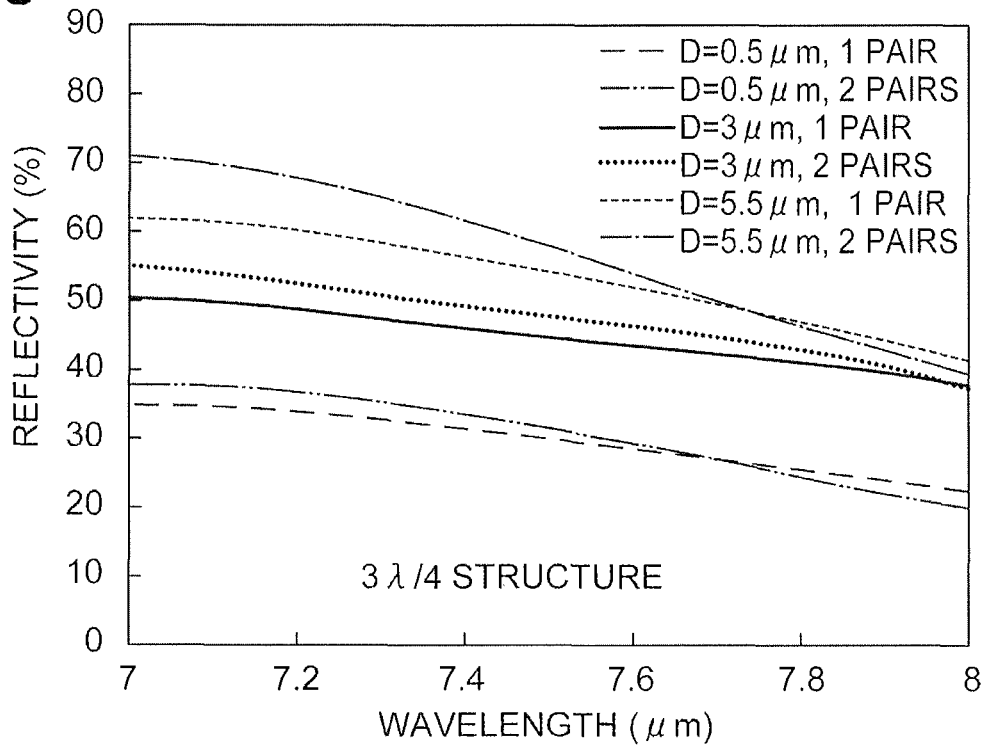
FIGS. 5A and 5B are views each illustrating a calculation result of a reflectivity of the distributed Bragg reflection region in a wavelength range of 7 to 8 micrometers.
Figure 5B:
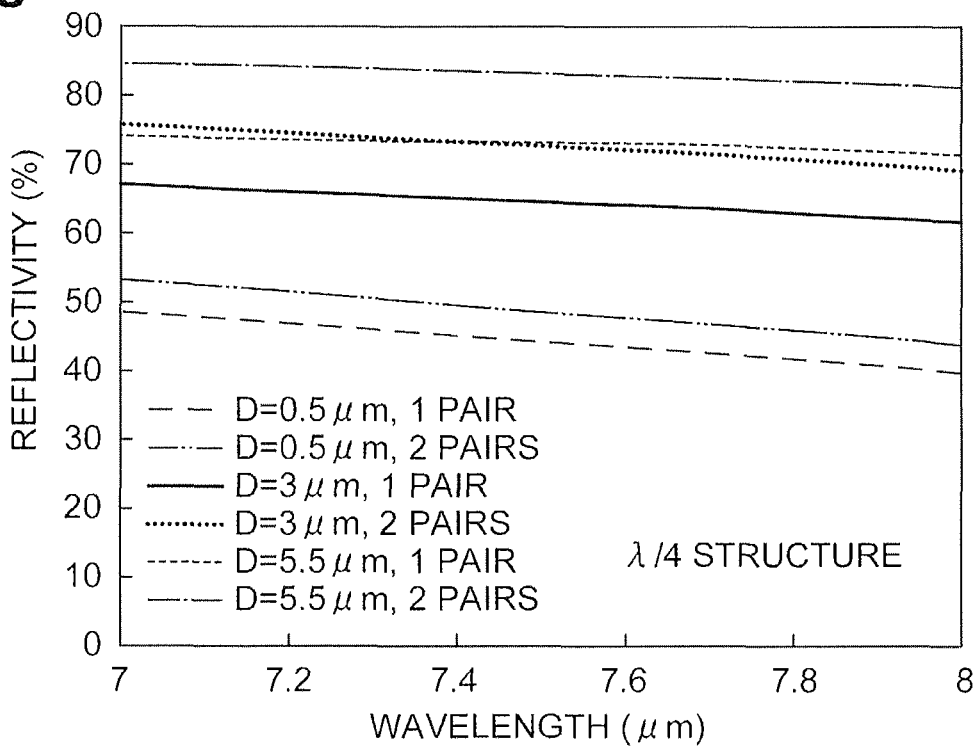

FIGS. 5A and 5B illustrate the calculation results of the reflectivity of the distributed Bragg reflection region for light in the range of the wavelength of 7 to 8 micrometers, and FIG. 6 shows a table of reflectivity values at the oscillation wavelength (7.54 micrometers) among the calculation results. Specifically, FIGS. 5A and 5B illustrate the calculation results of the distributed Bragg reflection region having the $3\lambda/4$ structure and the distributed Bragg reflection region having the $\lambda/4$ structure, respectively. The individual distributed Bragg reflection region includes one to two pairs of the high refractive index portions and the low refractive index portions.

Referring to FIGS. 5A and 5B, the tendency of reflectivity in the distributed Bragg reflection structures of the λ/4 structure and the 3λ/4 structure reveals that the structure formed without etching the substrate (D=0.5 micrometer) indicates a low reflectivity compared to the distributed Bragg reflection structure formed by etching the substrate. Referring to FIG. 6, the reflectivity of the 3λ/4 structure, formed without etching the substrate (i.e., D=0.5 μm), at the oscillation wavelength (7.54 micrometers) is 29.4% for the distributed Bragg reflection structure of one pair and is about 30.6% for the distributed Bragg reflection structure of two pairs. These values are nearly as low as the reflectivity (about 30%) of a cleavage end facet, which does not include the distributed Bragg reflection structure. Also, the reflectivity of the λ/4 structure, formed without etching the substrate (D=0.5 μm), at the oscillation wavelength (7.54 micrometers) is 44% for the distributed Bragg reflection structure of one pair and is about 48.3% for the distributed Bragg reflection structure of two pairs. These values of the reflectivity are a little larger than the reflectivity of the cleavage end facet. These distributed Bragg reflection structures of this type cannot have a high reflectivity because the light component propagating in a surface layer of the semiconductor substrate cannot be reflected by the structures (the distributed Bragg reflection structure formed without etching the semiconductor substrate) to pass through the distributed Bragg reflection structures. The above results show that the singularity at the boundary between the distributed Bragg reflection region and the laser body region has not been solved yet.

Figure 7:
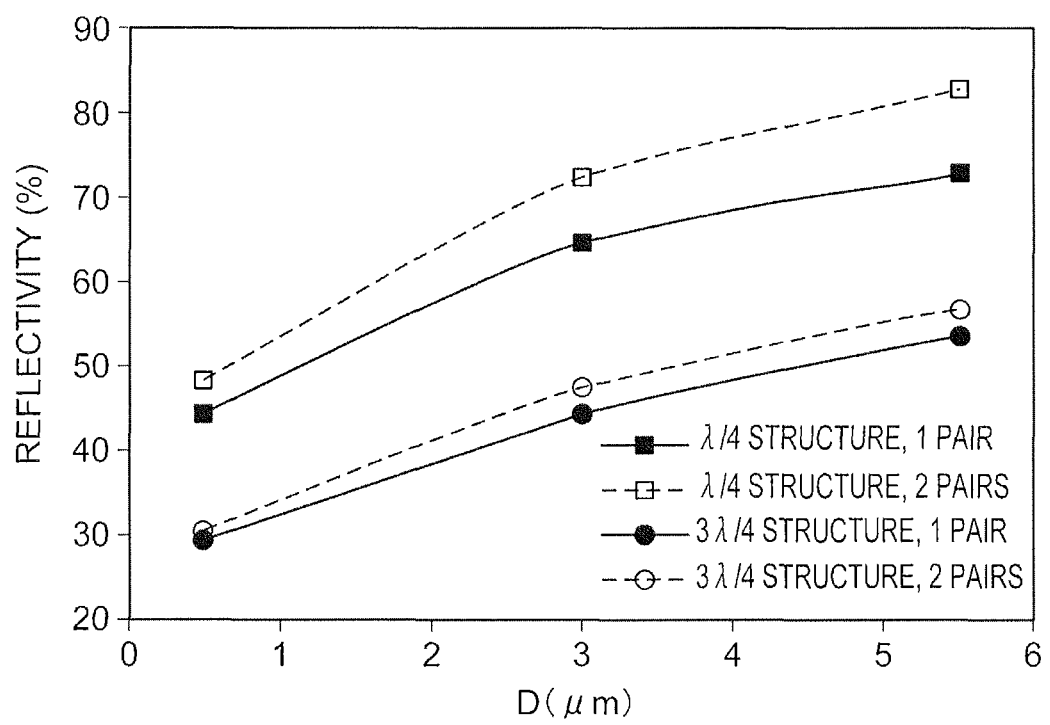
FIG. 7 is a graph illustrating a relationship between a distance D and the calculated reflectivity at the oscillation wavelength (7.54 micrometers).

In contrast, the present embodiment uses the distributed Bragg reflection structure that is formed by etching the semiconductor substrate 13. As shown in FIGS. 5A and 5B, the reflectivity of the distributed Bragg reflection structure increases with the distance D which is the etching amount of the substrate. In order to give a description thereof in more detail, FIG. 7 shows a relationship between the distance D and the calculation values of the reflectivity at the oscillation wavelength (7.54 micrometers). Referring to FIG. 7, the reflectivity significantly increases with the distance D of the etching amount, and the reflectivity at the distance D=5.5 micrometers is extremely high compared to that in the distributed Bragg reflection region (D=0.5 micrometer) formed without etching the substrate. The reason why the reflectivity of the distributed Bragg reflection region increases together with increase in the distance D is that, as already described, a part of the propagating light is extended over a depth in an upper portion of the semiconductor substrate and that the upper portion of the semiconductor substrate is etched to the depth to form the low refractive index portions of the distributed Bragg reflection region, so that the distributed Bragg reflection region also reflects the light component propagating in the semiconductor substrate by the interfaces of the low refractive index portions and the high refractive index portions of the distributed Bragg reflection regions. As a result, the distributed Bragg reflection structure according to the present embodiment can effectively reflect the entire light including the light components propagating in the semiconductor substrate and in the core layer and the semiconductor region near the core layer. The increase in the distance D allows the reflectivity of the distributed Bragg reflection region to increase. This enhancement in reflectivity is due to the fact that the increased distance D allows the distributed Bragg reflection region to reflect more amount of the light component propagating in the semiconductor substrate. The reflectivity of the distributed Bragg reflection region is inclined to saturation in a region of the substrate having the distance D of equal to or longer than 3 micrometers, because it seems that the part of the light propagating in the substrate of D≥3 μm is small even when the substrate is deeply etched and that this small amount of the propagating light also makes an amount of reflected light small compared to the substrate of D≤3 μm. In the distributed Bragg reflection region with the substrate etched as deep as 5.5 μm or more, the increment in the reflectivity of the distributed Bragg reflection region is minute. The reason is that the distribution of the light in the substrate in the direction of the Z axis is roughly in the range (D≤5.5 μm) and that the distributed Bragg reflection region formed by such a deep etching of the substrate cannot increase the reflection amount of the light. According to the calculation result, it is desirable that the distance D indicating the etching amount is 3 micrometers or deeper, and preferably, 5.5 micrometers or deeper.

As described above, the semiconductor wall 33 includes the second semiconductor layer 43 (second core layer) having the same structure as the core layer 23. In the direction of the axis normal to the principal surface 13a of the semiconductor substrate 13, the bottom of the bottom portion 33a of the semiconductor wall 33 is apart from the lower surface of the second semiconductor layer 43 (the second core layer) by a distance of 5.5 micrometers or longer. In the quantum cascade laser, when the distance D between the bottom of the semiconductor wall 33 and the lower surface of the second semiconductor layer 43 in the semiconductor wall 33 is 5.5 micrometers or longer, the distributed Bragg reflection region 17 (19) has an extremely high reflectivity of 80% or higher, which is 2.5 times or more of the reflectivity (about 30%) of the end facet formed by cleavage. The distributed Bragg reflection region having such a high reflectivity can easily reduce the threshold current and improve lasing characteristics of the quantum cascade laser 11.

Referring to FIGS. 5A and 5B, in such a case that the λ/4 and 3b/4 structures are formed by etching the respective semiconductor substrates by the same etching amount of the distance D, the reflectivity of the λ/4 structure is higher than that of the 3λ/4 structure, and also wavelength dependency of the reflectivity of the λ/4 structure is smaller than that of the 3λ/4 structure. As described above, use of the λ/4 structure can provide a more excellent reflection mirror of a laser cavity. Referring to FIG. 6, in the λ/4 structure having the distance D of 5.5 micrometers corresponding to the etching amount, the distributed Bragg reflection region of two pairs indicates the reflectivity of 83.1% at the oscillation wavelength of 7.54 micrometers, and the value of the reflectivity is as high as 2.5 times or more as compared to the reflectivity (about 30%) of the cleaved end facet. The high reflectivity exceeding 80% makes the reduction of the threshold current in the quantum cascade laser easier. As described above, the distributed Bragg reflection region of the λ/4 structure results in an excellent performance compared to the distributed Bragg reflection region of the 3λ/4 structure. The reason is that the distributed Bragg reflection region of the λ/4 structure having a width, which is one third of that of the distributed Bragg reflection region of the 3λ/4 structure, can suppress diffusion of the light propagating in the distributed Bragg reflection region, resulting in suppressing the reduction in reflectivity caused by the diffraction. From such a reason, it is more preferable to apply the λ/4 structure to the distributed Bragg reflection region. As shown in FIG. 4, the width (WH) of the semiconductor wall for the high refractive index portion in the distributed Bragg reflection region of the λ/4 structure is 0.6064 micrometer, and this small value requires a high-precision process in the fabricating method. In contrast, the width (WH) of the semiconductor wall for the high refractive index portion in the distributed Bragg reflection region of the 3λ/4 structure is 1.8192 micrometers, and the 3λ/4 structure can prevent the semiconductor wall for the high refractive index portion from having a width (WH) of a sub-micron size, so that the distributed Bragg reflection region may be more easily formed using a general fabricating apparatus.

Figure 8:
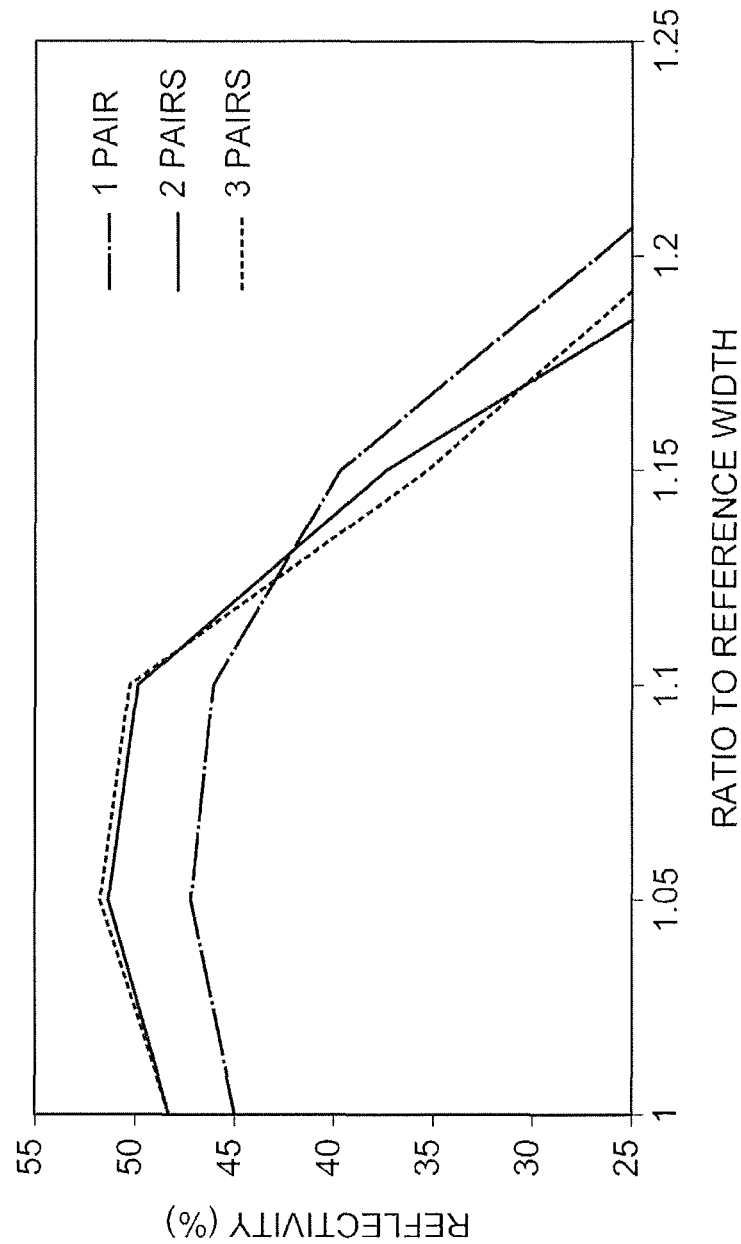
FIG. 8 is a graph illustrating the dependence of the calculated reflectivity of the distributed Bragg reflection region on variation in the width WL of the low refractive index portion and the width WH of the high refractive index portion.

Next, using the above-described calculation model and the calculation method, the change of the reflectivity of the distributed Bragg reflection region in response to the variation of the widths WL and WH of the low and high refractive index portions is estimated. FIG. 8 illustrates calculation results showing the reflectivity of the distributed Bragg reflection region as a function of the variation of the width WL of the low refractive index portion and the width WH of the high refractive index portion. In the calculation, the calculation model having the distributed Bragg reflection region of the 3λ/4 structure with the distance D=2.7 micrometers of the etching amount is used. In the calculation, the reflectivity of the distributed Bragg reflection region is calculated at the oscillation wavelength (7.54 micrometers) and the distributed Bragg reflection region has a width shifted from the reference width of the 3λ/4 structure illustrated in FIG. 4. Assuming that the widths of both of the low refractive index portion and the high refractive index portion vary at the same ratio with respect to the respective reference widths of the low and high refractive index portions, (for example, when WH varies to 1.1 times of the reference width, the WL also varies to 1.1 times of the reference width), the calculation of the reflectivity variation is carried out. The abscissa in FIG. 8 indicates the ratio to the reference widths of WL and WH illustrated in FIG. 4. Referring to FIG. 8, the reflectivity in the range where the variation ratio to the reference widths of WL and WH is in a range of higher than 1 time and 1.1 times or lower is equal to or higher than the reflectivity of a distributed Bragg reflection region in which the widths WL and WH has just the respective reference widths of the 3λ/4 structure. The ratio of the variation exceeding 1.1 times causes the reflectivity of the distributed Bragg reflection region to drastically decline. As a result, preferably, a variation width of the widths WL and WH in the low and high refractive index portions is set to be in the range of 1.0 time or larger and 1.1 times or smaller of the respective reference widths so as to obtain the distributed Bragg reflection region with a high reflectivity.

As described above, the thickness of the low refractive index portions 31b of the distributed Bragg reflection region 17 (19) in the direction of the X axis (the direction of the waveguide axis) is preferably set to be in the range of 1.0 to 1.1 times of the odd number multiple of λ/(4×n1). In addition, the thickness of the high refractive index portions 31a is preferably set to be in the range of 1.0 to 1.1 times of the odd number multiple of λ/(4×n2). Here, "λ" indicates the oscillation wavelength of the quantum cascade laser 11 in vacuum, "n1" indicates the effective refractive index of the low refractive index portions 31b at the oscillation wavelength, and "n2" indicates an effective refractive index of the high refractive index portions 31a at the oscillation wavelength. In the quantum cascade laser 11, the distributed Bragg reflection region 17 (19) where the widths of the high refractive index portions 31a and the low refractive index portions 31b are in the range of 1.0 to 1.1 times of the respective reference widths equal to the odd number multiple of λ/(4×n), achieves the reflectivity practically the same as or higher than the reflectivity of the ideal distributed Bragg reflection region 17 (19) including the high refractive index portions 31a and the low refractive index portions 31b of the widths equal to the respective reference widths.

Example 2

Figure 9:
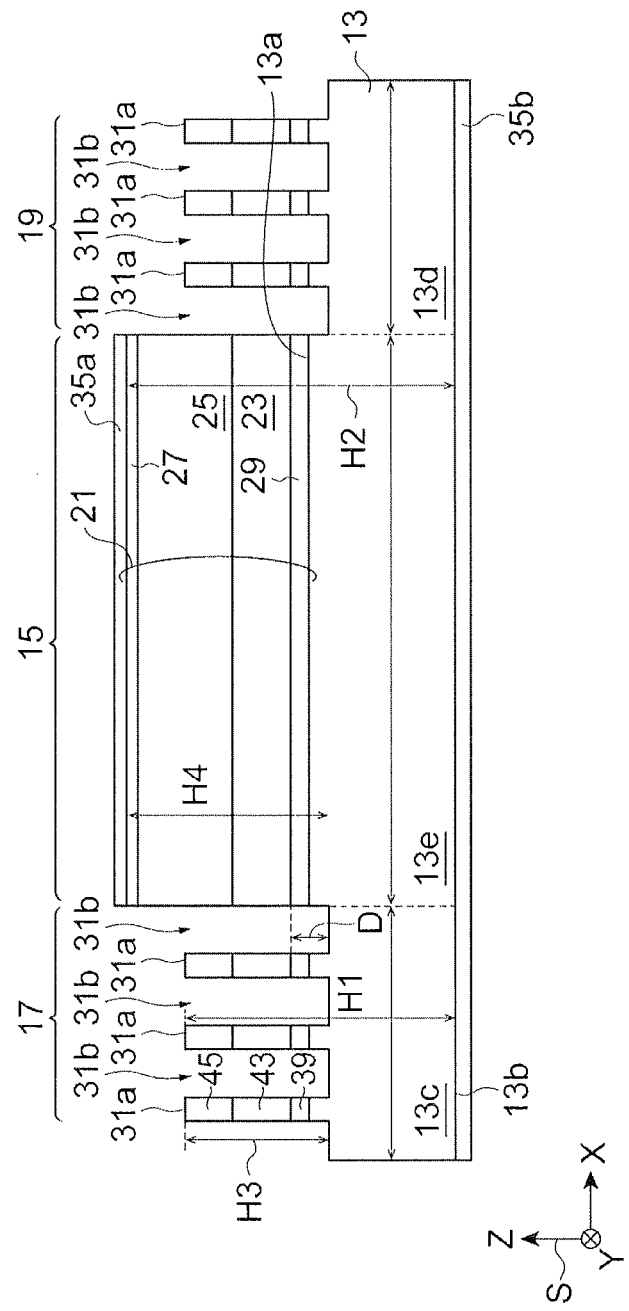
FIG. 9 is a schematic view illustrating a quantum cascade laser in which the high refractive index portion has a height H1 lower than a height H2 of a first semiconductor laminate structure of the laser body region thereof (H1<H2).

In the quantum cascade laser illustrated in FIG. 1, the first height H1 from the top of the high refractive index portion 31a of the distributed Bragg reflection region 17 (19) to the back of the substrate 13 is practically equal to the second height H2 from the top of the first semiconductor laminate structure 21 of the laser body region 15 to the back of the substrate 13 in the direction of the Z axis. The quantum cascade laser 11 according to the present embodiment is not limited to the structure in FIG. 1. FIG. 9 is a schematic view illustrating the quantum cascade laser which has the first height H1 lower than the second height H2 (H1<H2). Here, the first height H1 is defined as the distance from the back side of the substrate 13 to the top surface of the high refractive index portion 31a. The second height H2 is defined as the distance from the back side of the substrate 13 to the top surface of the first semiconductor laminate structure 21 of the laser body region 15. The third height H3 of the semiconductor wall 33 is lower than the fourth height H4 from the top of the laser body region 15 to the bottom of the low refractive index portion 31b. In the quantum cascade laser 11 in which the first height H1 is lower than the second height H2, when a light beam from the quantum cascade laser 11 is emitted with a narrow spread in the direction of the Z axis, the quantum cascade laser 11 having the high refractive index portions 31a may reflect the entire light. The high refractive index portions 31a of the above height can be provided with a desired high reflectivity. Various improvements described in the above-described embodiment are also achieved in this structure.

Figure 10:
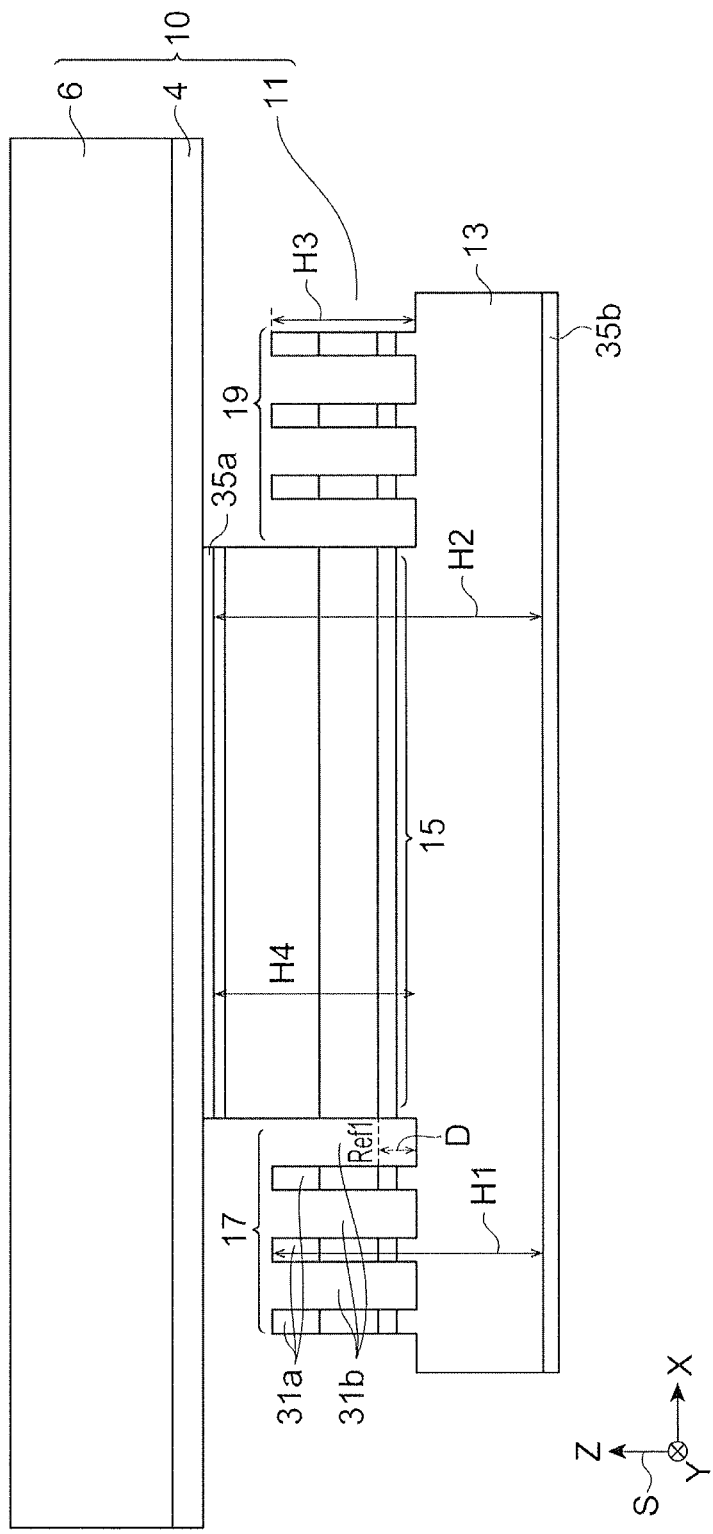
FIG. 10 is a view illustrating an assembly formed by mounting the quantum cascade laser illustrated in FIG. 9.

FIG. 10 illustrates an assembly 10 formed by mounting the quantum cascade laser illustrated in FIG. 9 on a submount (heat sink 6) in an epi-side down mounting configuration. In the structure of the above-described assembly 10, the first height H1 of the high refractive index portions 31a is lower than the second height H2 of the laser body region 15 in the direction of the Z axis. When the quantum cascade laser is mounted on the sub-mount (heat sink 6) in the epi-side down mounting configuration in a die-bonding process as illustrated in FIG. 10, the die-bonding can be carried out without contacting the high refractive index portions 31a with a top surface of the sub-mount (heat sink 6) or solder 4 on the sub-mount. This structure can avoid breakage of the high refractive index portions 31a by preventing the high refractive index portions 31a from physical damages during the die-bonding process in an epi-side down mounting, thereby improving the yield. In or AuSn may be used as a material of the solder 4, and Cu, diamond, AlN or the like may be used as a material of the sub-mount (heat sink 6).

Example 3

Figure 11:
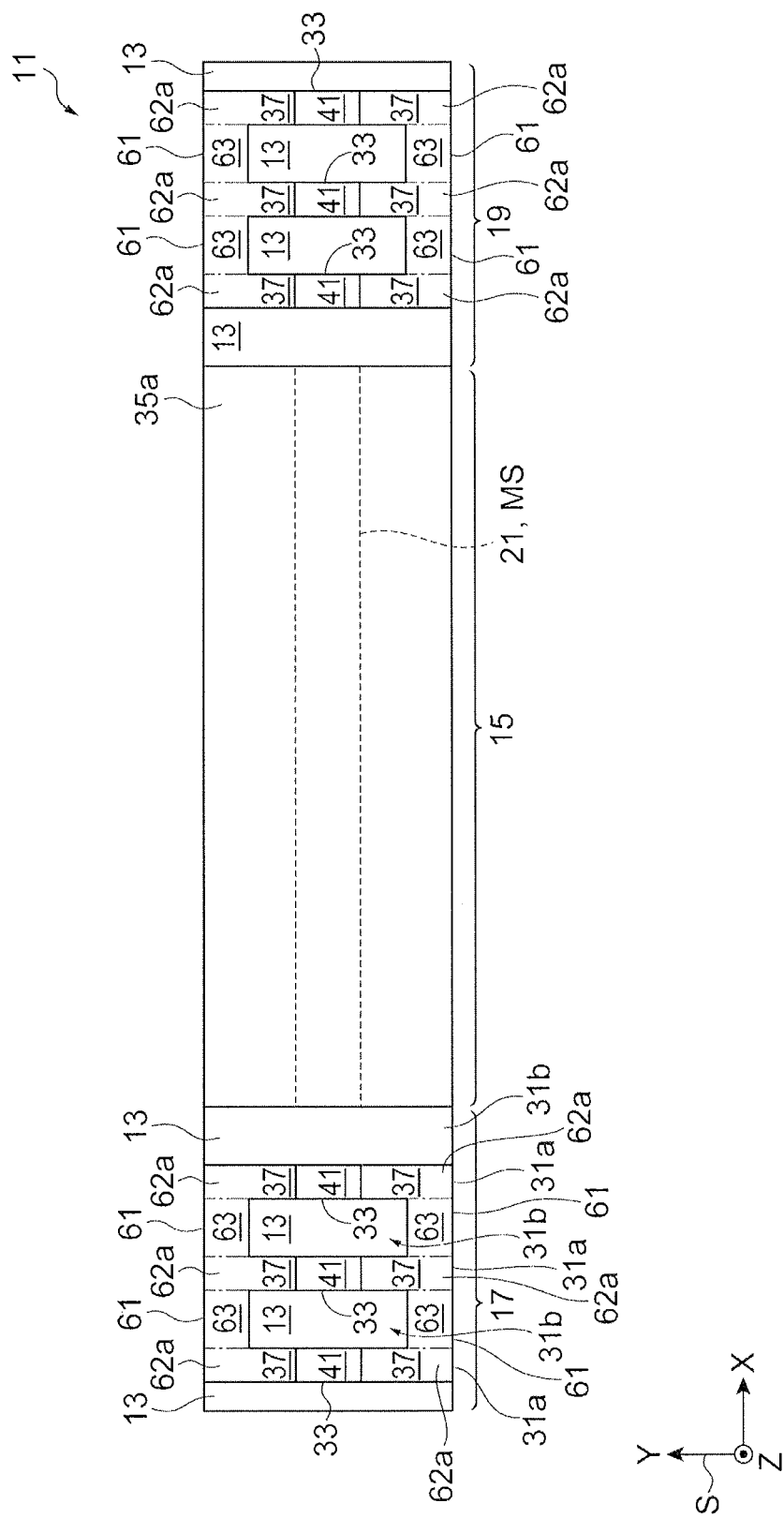
FIG. 11 is a plan view illustrating a structure of the quantum cascade laser according to the present embodiment.

FIG. 11 is a schematic drawing illustrating a structure of the quantum cascade laser according to the present embodiment. Referring to FIG. 11, a top plan view showing the upper surface of the quantum cascade laser 11 is depicted. In the examples as described above, the semiconductor wall 33 of each of the high refractive index portions 31a of the distributed Bragg reflection region 17 (19) is connected through the semiconductor substrate 13, but is not limited thereto. This structure, as shown in FIG. 11, may be such that each semiconductor wall 33 is connected to the other via a first reinforcement portion 61 located on the semiconductor substrate 13.

The distributed Bragg reflection region 17 (19) may further include the first reinforcement portion 61 that connects at least two high refractive index portions 31a (in the structure of FIG. 11, all the high refractive index portions 31a being connected) among the high refractive index portions 31a. In the quantum cascade laser 11, the first reinforcement portion 61 of the distributed Bragg reflection region 17 (19) includes a connection wall 63 that directly connects to the semiconductor wall 33 of the adjacent high refractive index portion 31a. The connection wall 63 extends in the direction of the waveguide axis (the direction of the X axis). The connection wall 63 and the adjacent semiconductor wall 33 are connected to each other independent of a route via the semiconductor substrate 13, and may form an integrated structure on the semiconductor substrate 13. The addition of the first reinforcement portion 61 can increase the mechanical strength of the distributed Bragg reflection region 17 (19) to suppress effectively the damage of the distributed Bragg reflection region 17 (19). In particular, the high refractive index portions 31a in the distributed Bragg reflection region 17 (19) are formed by being etched by about 3 to 5.5 micrometers from the lower surface of the core layer 23 to the semiconductor substrate 13. These high refractive index portions 31a makes the height from the substrate to the top of each high refractive index portion 31a (the third height H3 in Part (a) of FIG. 1) relatively high. In contrast, in order to configure the distributed Bragg reflection structure, the width (thickness) WH of the high refractive index portions 31a is a very small value, such as about 0.61 micrometer (in the distributed Bragg reflection structure of the $\lambda/4$ structure) or about 1.82 micrometers (in the distributed Bragg reflection structure of the $3\lambda/4$ structure). The ratio (aspect ratio (H3/WH)) of the width WH (thickness) to the height H3 of the high refractive index portions 31a has a relatively large value, which may lead to damages, deformations or the like in the high refractive index portions 31a. Accordingly, it is effective in providing the quantum cascade laser according to the present embodiment with the first reinforcement portion 61 that connects the high refractive index portions 31a. The first reinforcement portion 61 of the distributed Bragg reflection region 17 (19) can further improve the yield and durability of the device, and can evade variation in the reflection characteristics of the distributed Bragg reflection structure which may be caused by, for example, deformation of the high refractive index portions 31a.

With reference to the structure having, for example, a BH structure, a description will be given of a reinforcement structure according to the present example. As illustrated in FIG. 11, in this example, the high refractive index portions 31a are connected through the semiconductor burying layer 37 thereof by the first reinforcement portion 61 to form a structure integrating the semiconductor walls 33. The present example has the same structure as the quantum cascade laser 11 in FIG. 1 except for the reinforcement structure, and has technical contributions from the various improvements that are described in the example 1.

The first reinforcement portion 61 is made of semiconductor, which may include, for example, a semiconductor material usable for the semiconductor burying layer 37, such as InP, GaInAs, AlInAs, GaInAsP, AlGaInAs. These semiconductors lattice-match with the InP substrate, and are easily grown using a general apparatus for growth, such as MBE or OMVPE, so that the above semiconductors are preferably used as the material of the first reinforcement portion 61.

More specifically, the high refractive index portion 31a has a first region 62a connected to the first reinforcement portion 61. The first region 62a may be made of the same semiconductor material as the first reinforcement portion 61. When the first region 62a of the high refractive index portion 31a is made of the same semiconductor material as the first reinforcement portion 61, the first reinforcement portion 61 and the first region 62a of the high refractive index portion 31a are grown to form a uniform structure crystallographically integrated with each other, so that the strength of the distributed Bragg reflection region 17 (19) can be effectively increased. Since the first reinforcement portion 61 and the first region 62a of the high refractive index portion 31a can be formed of the same material together to simplify the fabricating process of the quantum cascade laser 11. In the above description, the first region 62a and the first reinforcement portion 61 are formed of the same semiconductor material. The material of the first reinforcement portion 61 is not limited to the above-described material that is the same as the first region 62a of the high refractive index portion 31a, and if needed, other semiconductor materials or materials different from the semiconductor which are capable of improving the mechanical strength of the distributed Bragg reflection region 17 (19) may be used.

Example 4

Figure 12:
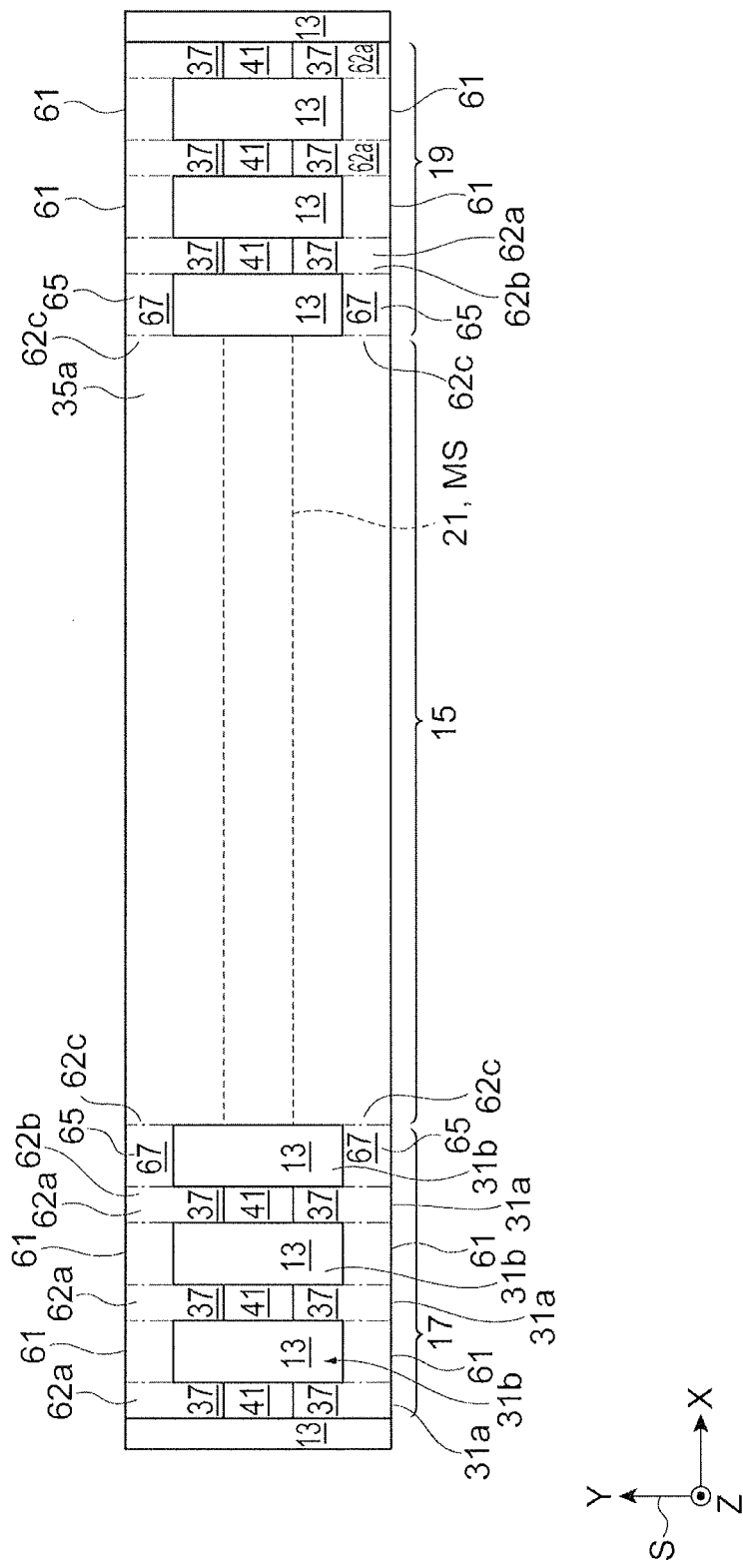
FIG. 12 is a plan view illustrating another structure of the quantum cascade laser according to the present embodiment.

FIG. 12 is a schematic view illustrating a structure of the quantum cascade laser according to the present embodiment. Referring to FIG. 12, a top plan view showing the upper surface of the quantum cascade laser 11 having a BH structure is depicted as an example. The distributed Bragg reflection region 17 (19) may further include a second reinforcement portion 65 that connects to the high refractive index portion 31a and the semiconductor burying layer 37 of the laser body region 15. The laser body region 15 may be connected to the high refractive index portion 31a of the distributed Bragg reflection region 17 (19) via the second reinforcement portion 65. The distributed Bragg reflection region 17 (19) includes a bridging wall 67 for the second reinforcement portion 65 which connects the laser body region 15 to the semiconductor wall 33 of the high refractive index portion 31a closest to the laser body region 15. The bridging wall 67 extends in the direction of the waveguide axis (the direction of the X axis). Specifically, the semiconductor wall 33 and the laser body region 15 are connected via the bridging wall 67 for the second reinforcement portion 65 independent of a route via the semiconductor substrate 13, and can form an integrated structure on the semiconductor substrate 13. The addition of the second reinforcement portion 65 can increase the mechanical strength of the distributed Bragg reflection region 17 (19) to suppress effectively the damage of the distributed Bragg reflection region 17 (19). The second reinforcement portion 65 of the distributed Bragg reflection region 17 (19) can improve the yield and durability of the device.

If needed, as illustrated in FIG. 12, the distributed Bragg reflection region 17 (19) can include the first reinforcement portion 61, which connects to a part or all of the high refractive index portions 31a, in addition to the second reinforcement portion 65. The present example is the same structure as FIG. 11 except for the second reinforcement portion 65, and has the technical contributions from the various improvements described in the example 1 and the example 3.

For example, the high refractive index portion 31a has a second region 62b, which is connected to the second reinforcement portion 65, in a region of the semiconductor burying layer 37. The second region 62b of the high refractive index portion 31a may be formed of the same semiconductor material as the second reinforcement portion 65. When the second region 62b of the high refractive index portion 31a is formed of the same semiconductor material as the second reinforcement portion 65, the second reinforcement portion 65 and the second region 62b of the high refractive index portion 31a are grown so as to be crystallographically integrated with each other to form a uniform structure, thereby effectively increasing the strength of the distributed Bragg reflection region 17 (19). The second region 62b of the high refractive index portion 31a and the second reinforcement portion 65 can be formed together using the same material to simplify the fabricating process of the quantum cascade laser 11.

The laser body region 15 includes a connection region 62c in the region of the semiconductor burying layer 37 that is connected to the second reinforcement portion 65. The connection region 62c may be formed of the same semiconductor material as the second reinforcement portion 65. When the connection region 62c of the laser body region 15 is formed of the same semiconductor material as the second reinforcement portion 65, the connection region 62c and the second reinforcement portion 65 are grown so as to be crystallographically integrated with each other to form a uniform structure, thereby effectively increasing the strength of the distributed Bragg reflection region 17 (19). The connection region 62c and the second reinforcement portion 65 can be formed together using the same material to simplify the fabricating process of the quantum cascade laser 11.

Semiconductor may be used as material of the second reinforcement portion 65, similarly to the first reinforcement portion 61, and the second reinforcement portion 65 may include, for example, a semiconductor material usable for the semiconductor burying layer 37, specifically the semiconductor, such as InP, GaInAs, AlInAs, GaInAsP, or AlGaInAs. These semiconductors may lattice-match with the InP substrate, and can be easily grown using a general apparatus for growth, such as MBE or OMVPE, so that the semiconductors are suitable as the material of the second reinforcement portion 65. In particular, when the second reinforcement portion 65 and the second region 62b in the semiconductor burying layer 37 of the high refractive index portion 31a are both formed of semiconductor, such as Fe—InP, the second reinforcement portion 65 and the high refractive index portion 31a are grown so as to be crystallographically integrated with each other to form a uniform structure, thereby effectively increasing the strength of the distributed Bragg reflection region 17 (19). In addition, the second region 62b and the second reinforcement portion 65 can be formed together using the same material to contribute to simplification of the fabricating process.

Further, when the second region 62b in the semiconductor burying layer 37 of the high refractive index portion 31a, the second reinforcement portion 65, and the connection region 62c in the semiconductor burying layer 37 of the laser body region 15 are formed of the same semiconductor (for example, Fe—InP) so as to be crystallographically integrated with each other to form a uniform structure, thereby effectively increasing the strength of the distributed Bragg reflection region 17 (19). The second region 62b, the second reinforcement portion 65, and the connection region 62c can be formed together using the same material to contribute to the simplification of the fabricating process. In particular, the second region 62b in the semiconductor burying layer 37 of the high refractive index portion 31a, the first reinforcement portion 61, the second reinforcement portion 65, and the connection region 62c in the semiconductor burying layer 37 of the laser body region 15 are formed of the same semiconductor (for example, Fe—InP) to further improve the mechanical strength of the distributed Bragg reflection region 17 (19).

Example 5

Figure 13:
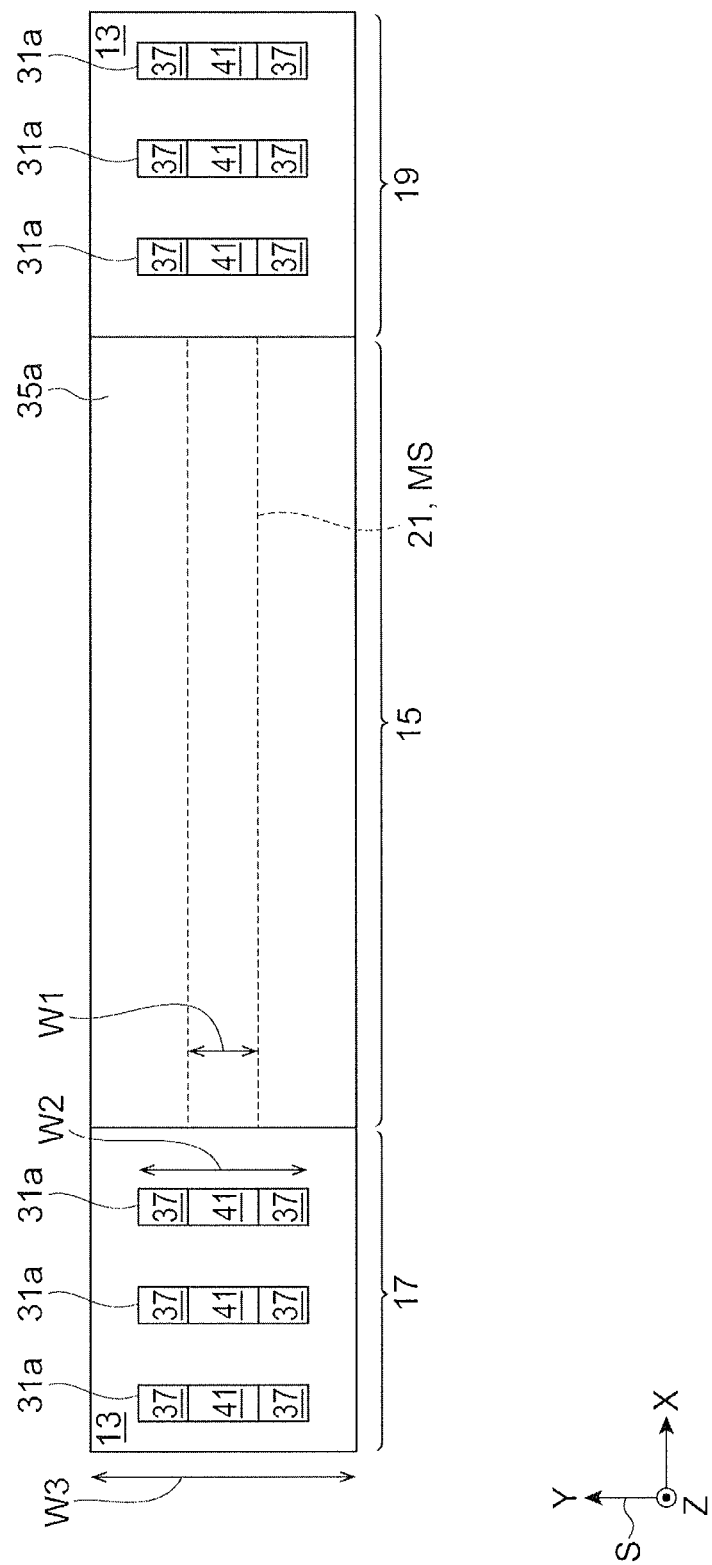
FIG. 13 is a plan view illustrating yet another structure of the quantum cascade laser according to the present embodiment.

FIG. 13 is a plan view illustrating a structure of the quantum cascade laser according to the embodiment. A width W2 of the high refractive index portion defined in the Y direction may be shorter than the width W3 of the device (the width of the substrate). The technical contributions described in the example 1 are applied to this structure. In addition, this structure has the high refractive index portions of the width W2 shorter than the width W3 of the device, and makes a ratio of the width W2 of the high refractive index portion 31a to the width W3 of the device small, so that the high refractive index portions 31a has a high rigidity to enhance a high mechanical strength.

Example 6

A method of fabricating the quantum cascade laser 11 having the BH structure will be briefly described. In the following description, if possible, reference symbols in the description already given for the quantum cascade laser 11 will be used. In an epitaxial growth process, on the principal surface of the semiconductor substrate 13, semiconductor layers for the buffer layer 29, the core layer 23, the upper cladding layer 25, and the contact layer 27 are grown to form a semiconductor laminate. On the semiconductor laminate, a mask for forming the mesa waveguide MS is formed. The semiconductor laminate is etched using the mask for forming the mesa waveguide MS having a stripe shape. Thereafter, the semiconductor burying layer 37 is grown without removing the mask to embed the mesa waveguide MS.

On the mesa waveguide MS and the semiconductor burying layer 37, a mask 73 for the distributed Bragg reflection region 17 (19) is formed. The mesa waveguide MS and the semiconductor burying layer 37 are etched with the mask 73 to form the distributed Bragg reflection region 17 (19) and the laser body region 15.

Figure 14:
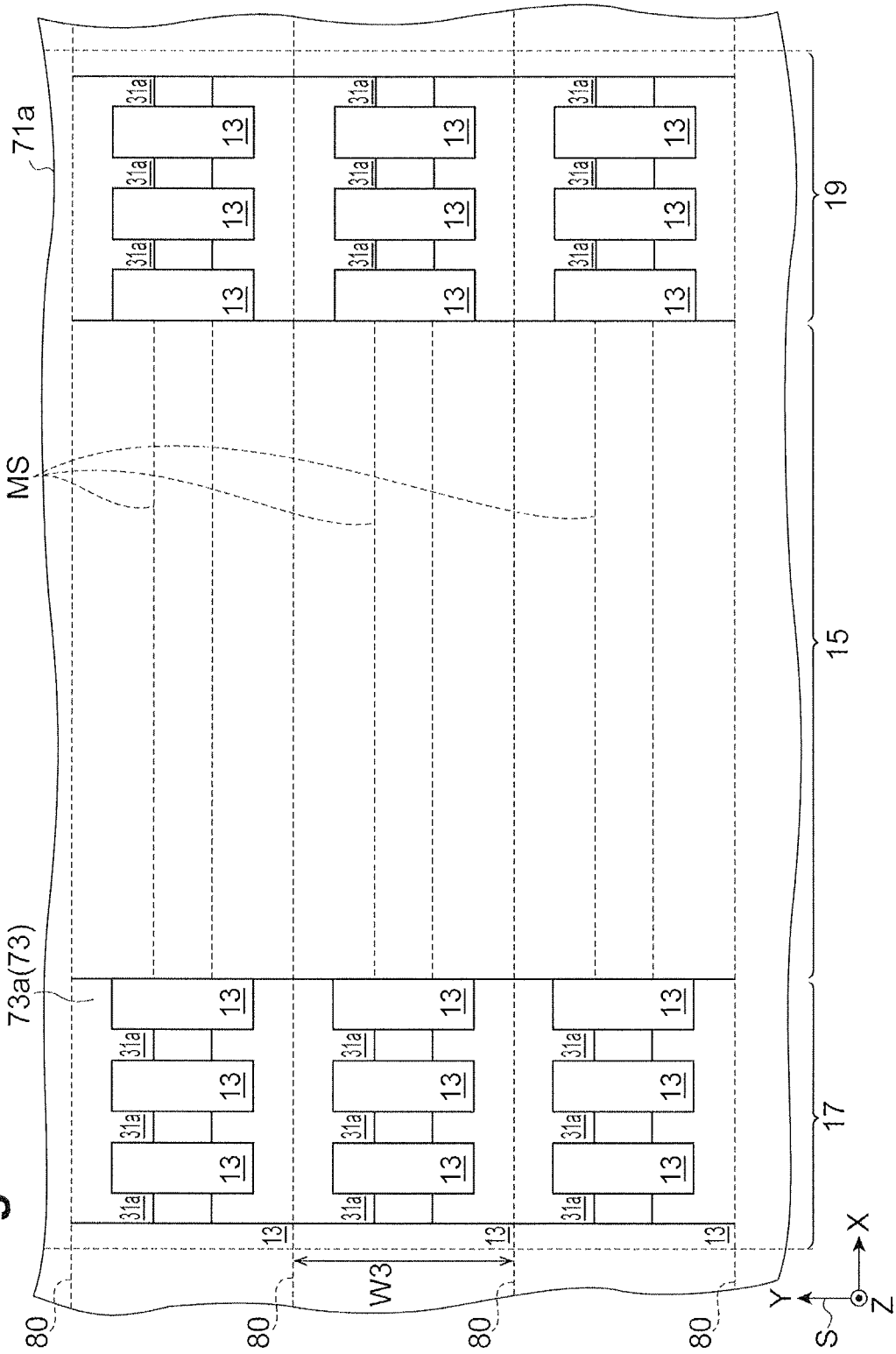
FIG. 14 is a plan view illustrating a substrate product in a process of forming a distributed Bragg reflection region and a laser body region by etching.

FIG. 14 is a plan view illustrating a substrate product in a process of forming the distributed Bragg reflection region 17 (19) and the laser body region 15 by etching in the fabrication processes of fabricating the structure of the example 4 (FIG. 12). A substrate product 71a illustrated in FIG. 14 includes typical three device sections. The pattern of a mask 73a, which is one of examples of the mask 73 for the distributed Bragg reflection region 17 (19), extends in the direction of the Y axis across boundaries 80 between the device sections in the substrate product 71a so that the width of the laser body region 15 and the width of the high refractive index portion 31a are equal to the width W3 of the device, as illustrated in FIG. 14. As illustrated in this figure, the mask 73a covers semiconductor areas other than the semiconductor that is to be etched to form the low refractive index portions 31b. Specifically, the mask 73a covers the laser body region 15, and the high refractive index portions 31a, the first reinforcement portion 61 and the second reinforcement portion 65 for the distributed Bragg reflection regions 17 and 19. By the etching, the laser body region 15 and the distributed Bragg reflection regions 17 and 19 that include the first reinforcement portion 61 and the second reinforcement portion 65 are formed. The distributed Bragg reflection region 17 (19) of this structure is excellent in terms of the mechanical strength derived from the addition of the reinforcement portions.

Figure 15:
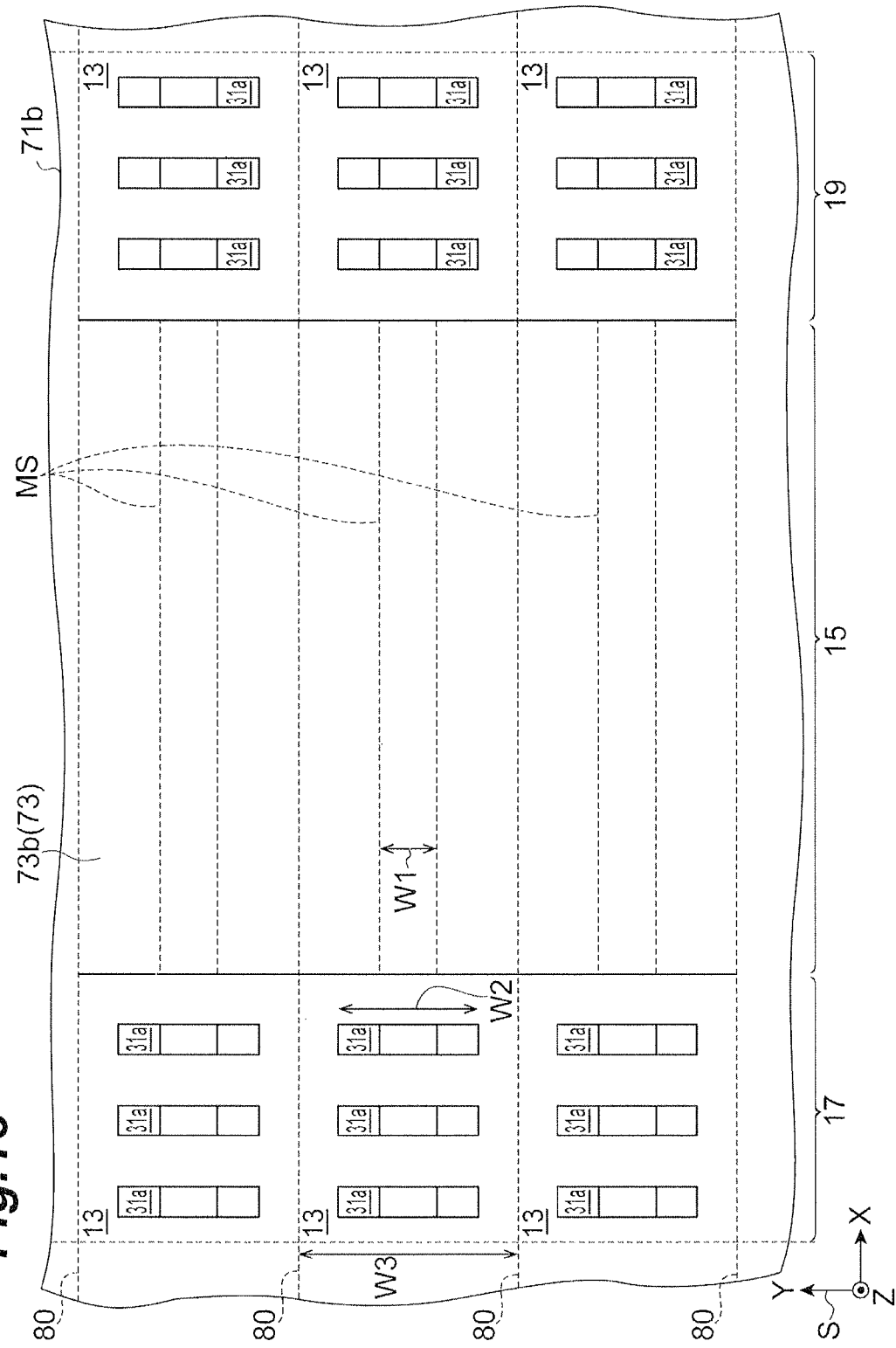
FIG. 15 is a plan view illustrating a substrate product in a process of forming a distributed Bragg reflection region and a laser body region by etching.

FIG. 15 is a plan view illustrating the substrate product in the process of forming the distributed Bragg reflection region 17 (19) and the laser body region 15 by etching in the fabrication processes for the structure of the example 5 (FIG. 13). A substrate product 71b illustrated in FIG. 15 includes typical three device sections. The pattern of a mask 73b, which is another example of the mask 73 for the distributed Bragg reflection region 17 (19), cover semiconductor areas in which the high refractive index portions 31a and the laser body regions 15 are to be formed. Both ends of each pattern of the mask 73b are set back inside to be apart from boundaries 80 on the substrate product 71b, so that the width W2 of the high refractive index portion 31a is shorter than the width W3 of the device. As illustrated in this figure, the patterns of the mask 73b cover semiconductor areas other than the semiconductor areas that are is to be etched to form the low refractive index portions 31b. Specifically, the patterns of the mask 73b cover the laser body region 15 and the high refractive index portions 31a for the distributed Bragg reflection regions 17 and 19. By the etching, the laser body region 15 and the distributed Bragg reflection regions 17 and 19 are formed.

In this structure, separation regions are disposed on the boundaries of the sections to separate the adjacent distributed Bragg reflection regions 17 (19) apart from each other. Each separation region facilitates an etching-gas flow in the direction of the X axis therethrough in the process of forming the high refractive index portions 31a by dry etching, thereby improving circulation of the etching gas. This mask pattern can reduce the variation in an etching rate, caused by a microloading effect, within a substrate surface, so that the uniformity and reproducibility of etching within the substrate surface are improved in a process of forming the high refractive index portions 31a. In addition, the semiconductor substrate 13 including the arrayed device sections shown in FIG. 15 is separated into individual semiconductor chips without dividing the semiconductor walls of the high refractive index portions 31 for the distributed Bragg reflection region 17 (19), so that the high refractive index portions 31a are not subject to damage. Therefore, the present device structure that has the separation region can prevent the yield from lowering in the device separation process, when compared to the structure of the example 1 that has no separation region.

In the above description, the distributed Bragg reflection regions 17 and 19 are integrated on the semiconductor substrate 13 such that the laser body region 15 is interposed therebetween. The present embodiment is not limited thereto, and the distributed Bragg reflection region 17 (19) may be provided on either one side of the laser body region 15.

Further, in the above description, the calculation results of the reflectivity for the distributed Bragg reflection regions that have one or two pairs of the high refractive index portions 31a and the low refractive index portions 31b have been described. The number of the pairs is not limited thereto, and an arbitrary number of pairs may be selected as needed. High reflection is provided for the distributed Bragg reflection region 17 (19) as the number of the pairs increases.

The quantum cascade laser 11 according to the present embodiment may emit a mid-infrared laser beam within, for example, a wavelength range of 3 to 20 µm, and can be used in technical fields, such as environmental gas analysis, medical diagnosing and industrial processing. The quantum cascade laser 11 generates light emission through radiative transition of electrons between sub-bands in a conduction band of the core layer (light emitting layer), so that the quantum cascade laser 11 includes the cause of an optical gain deterioration caused by non-radiative transition due to LO phonon scattering. Accordingly, current needed for lasing, i.e., a threshold current, has an amount of about several hundred mill-amperes (mA) to several amperes (A), and such a large threshold current increases power consumption.

The threshold current (power consumption) is effectively reduced by applying a distributed Bragg reflection region as a reflection mirror of the laser cavity. For example, Non-Patent Literature discloses a semiconductor laser for optical communications to which a distributed Bragg reflection region is added. The distributed Bragg reflection region may be effective in the reduction of the threshold current for the quantum cascade laser, and have examined to introduce the distributed Bragg reflection region to the present laser similarly to the semiconductor laser for the optical communications. The distributed Bragg reflection region generates optical reflection at the interfaces between the low refractive index portions and the high refractive index portions due to the difference in refractive index between the low refractive index portions and the high refractive index portions, whereby the distributed Bragg reflection region can significantly increase actual reflectivity of the reflection mirror of the cavity.

The device lifetime of about one million hours (Hs) is demanded for highly reliable semiconductor lasers for optical communications including a semiconductor laser in which the distributed Bragg reflection region is integrated. Various considerations are given in terms of processes and materials. For the high reliability, a semiconductor wafer which is, for example, highly doped (the density higher than $1\times10^{18}$ cm$^{-3}$) and has an excellent crystal quality with a low etch pit density is used almost exclusively as the substrate. The lower cladding layer, the active layer and the upper cladding layer are grown on this semiconductor substrate. In the conventional semiconductor laser for optical communications, the thickness of the lower cladding layer is about 1 to 1.5 micrometers for the optical confinement. The lower cladding layer is etched in forming the distributed Bragg reflection region in the semiconductor laser for optical communications, but the substrate is not etched therein.

It is found that the above quantum cascade laser which integrates with a distributed Bragg reflection region has singularity at the boundary between the distributed Bragg reflection region and the laser body region. The conventional semiconductor laser for optical communications has the distributed Bragg reflection region in which an etching bottom is located within the lower cladding layer of the thickness of 1 to 1.5 micrometers but above the substrate. In the conventional semiconductor laser for optical communications, the light having a short lasing wavelength of 1.3 to 1.55 µm propagates in the distributed Bragg reflection region. The propagating light does not spread to the substrate, and therefore it is hardly distributed in the substrate region in the direction of the axis normal to the principal surface of the substrate. Even when the conventional semiconductor laser for optical communications has the distributed Bragg reflection region formed by stopping the etching within the lower cladding layer, the conventional semiconductor laser sufficiently high reflection characteristics. The distributed Bragg reflection region of this conventional semiconductor laser for optical communications may reflect the entire propagating light. On the other hand, the distributed Bragg reflection region in a mid-infrared quantum cascade laser exhibits an effective reflectivity lower than that in the conventional semiconductor laser for optical communications. This shows that the quantum cascade laser has singularity. The reason why the distributed Bragg reflection region in a mid-infrared quantum cascade laser emitting a wavelength of 3 to 20 μm has such a low reflectivity may be considered as follows: the spread of the propagating light in the quantum cascade laser is, for example, about 10 micrometers in the direction of the axis normal to the principal surface of the semiconductor substrate due to a long wavelength of the propagating light; a large proportion of the light is therefore distributed within the substrate; the light component that is distributed within the substrate is not reflected by the distributed Bragg reflection region formed without etching the substrate, thereby passing through the substrate in the distributed Bragg reflection region. If the distributed Bragg reflection region of the conventional semiconductor laser for optical communications is applied to the mid-infrared quantum cascade laser, the distributed Bragg reflection region can reflect only a part of the light propagating in the quantum cascade laser and is not provided with the high reflectivity that the semiconductor laser for optical communications exhibits.

A thick lower cladding layer of about 3 to 5 μm prevents the light propagating in the quantum cascade laser from spreading to the substrate. With such a thick lower cladding layer, the light propagating through the semiconductor region that underlies the core layer is almost confined into the lower cladding layer in the direction of an axis normal to the principal surface of the substrate, and is not distributed in the substrate. Similarly to the distributed Bragg reflection region of the conventional semiconductor laser for optical communications, the mid-infrared quantum cascade laser having such a thick lower cladding layer may be also provided with a high reflectivity without etching the substrate. Growing such a thick cladding layer, however, imposes a large burden on the fabrication, leading to deterioration of productivity and cost increase.

In the embodiment, it is found, in the structure formed without growing semiconductor for the cladding layer, which is to be located under the core layer, the light spreads in the semiconductor substrate, and propagates therein. In order to evade the singularity of the distributed Bragg reflection region in this structure, grooves formed for the distributed Bragg reflection structure reach the semiconductor substrate, and the semiconductor walls for the distributed Bragg reflection structure includes a part of the semiconductor substrate. The semiconductor substrate is to be etched, and in the latter half of an etching process for forming the distributed Bragg reflection structure, the semiconductor substrate formed of a single material is to be etched. In order to provide the distributed Bragg reflection structure with side faces with high verticality, dry etching allowing vertical etching may be used. Note that, highly-doped semiconductor substrates have light absorption caused by free carriers therein. In order to avoid the light absorption, a semiconductor substrate having a low dopant density equal to or lower than about $5\times10^{17}$ $cm^{-3}$ is used for the quantum cascade laser according to the present embodiment. This substrate with such a low dopant density can effectively reduce the free carrier absorption. For example, an absorption coefficient of the n-type InP substrate with the dopant density of $1\times10^{18}$ $cm^{-3}$ exceeds 20 $cm^{-1}$ at a wavelength of 4 micrometers. In contrast, a free carrier absorption coefficient of the n-type InP substrate with the low dopant density of $5\times10^{17}$ $cm^{-3}$ is about 9 $cm^{-1}$, which can be used for the lower cladding layer. In the present structure, prior to epitaxial growth for the core layer, a thin buffer layer (with a thickness equal to or smaller than 0.5 micrometer) may be grown on the principal surface of the semiconductor substrate.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:
1. A quantum cascade laser comprising:
a substrate having a principal surface;
a laser body region disposed on the principal surface of the substrate, the laser body region including a semiconductor laminate structure including a core layer disposed on the principal surface, the laser body region having a waveguide structure extending along a waveguide axis, the semiconductor laminate structure including an end facet intersecting with the waveguide axis; and
a distributed Bragg reflection region disposed on the principal surface of the substrate, the distributed Bragg reflection region including one or more low refractive index portions and one or more high refractive index portions, a high refractive index portion of the one or more high refractive index portions having a refractive index higher than that of a low refractive index portion of the one or more low refractive index portions, the one or more low refractive index portions and the one or more high refractive index portions being alternately arranged in a direction of the waveguide axis,
wherein the laser body region and the distributed Bragg reflection region are arranged in a direction of the waveguide axis,
the end facet of the semiconductor laminate structure is optically coupled to the distributed Bragg reflection region,
each of the one or more high refractive index portions includes a semiconductor wall extending in a direction intersecting with the principal surface of the substrate,
each semiconductor wall includes an upper portion and a lower portion that are arranged in the direction intersecting the principal surface of the substrate with the principal surface being disposed between the upper portion and the lower portion, and
the lower portion of each semiconductor wall includes a part of the substrate.
2. The quantum cascade laser according to claim 1,
wherein the substrate includes an n-type dopant, and
an impurity concentration of the n-type dopant is equal to or lower than $5\times10^{17}$ $cm^{-3}$.
3. The quantum cascade laser according to claim 1,
wherein the upper portion of the semiconductor wall in the distributed Bragg reflection region includes the core layer of the semiconductor laminate structure.

4. The quantum cascade laser according to claim 3, wherein, in the direction intersecting with the principal surface of the substrate, the lower portion of the semiconductor wall has a bottom that is apart from a lower surface of the core layer by 3 micrometers or more.

5. The quantum cascade laser according to claim 1, wherein each of the one or more low refractive index portions in the distributed Bragg reflection region has a thickness in a range of 1 to 1.1 times an odd number multiple of $\lambda/(4 \times n1)$, and each of the one or more high refractive index portions in the distributed Bragg reflection region has a thickness in a range of 1 to 1.1 times of an odd number multiple of $\lambda/(4 \times n2)$, where the thickness of the refractive index portions is defined in the direction of the waveguide axis, "$\lambda$" indicates a lasing wavelength of the quantum cascade laser in vacuum, "n1" indicates an effective refractive index of the one or more low refractive index portions at the lasing wavelength, and "n2" indicates an effective refractive index of the one or more high refractive index portions at the lasing wavelength.

6. The quantum cascade laser according to claim 1, wherein the distributed Bragg reflection region includes a first reinforcement portion connecting at least two high refractive index portions with each other.

7. The quantum cascade laser according to claim 6, wherein each of the high refractive index portions has a first region connected to the first reinforcement portion, and the first region of each high refractive index portion is made of a same semiconductor material as that of the first reinforcement portion.

8. The quantum cascade laser according to claim 1, wherein the distributed Bragg reflection region includes a second reinforcement portion connecting a nearest high refractive index portion among the one or more high refractive index portions with the laser body region.

9. The quantum cascade laser according to claim 8, wherein each of the one or more high refractive index portions has a second region connected to the second reinforcement portion, and
the second region is made of a same semiconductor material as that of the second reinforcement portion.

10. The quantum cascade laser according to claim 9, wherein the laser body region includes a connecting region connected to the second reinforcement portion, and the connecting region of the laser body region is made of the same semiconductor material as that of the second reinforcement portion.

11. The quantum cascade laser according to claim 1, wherein a distance between the principal surface of the substrate and a top surface of each of the one or more high refractive index portions in a direction of an axis normal to the principal surface of the substrate is shorter than a distance between the principal surface of the substrate and a top surface of the semiconductor laminate structure in the laser body region.

12. The quantum cascade laser according to claim 1, wherein each of the one or more high refractive index portions has a width shorter than that of the substrate, and the width of each of the one or more high refractive index portions and the width of the substrate are defined in a direction parallel to the principal surface of the substrate and orthogonal to the waveguide axis and an axis normal to the principal surface of the substrate.

* * * * *